United States Patent [19]

Black

[11] Patent Number: 4,774,462

[45] Date of Patent: Sep. 27, 1988

[54] AUTOMATIC TEST SYSTEM

[76] Inventor: Thomas J. Black, 38 Maureen Dr., Smithfield, R.I. 02917

[21] Appl. No.: 619,051

[22] Filed: Jun. 11, 1984

[51] Int. Cl.$^4$ ............... G01R 1/04; G01R 1/073
[52] U.S. Cl. ..................... 324/158 F; 324/73 PC; 324/158 P
[58] Field of Search ........... 324/73 PC, 158 P, 158 F, 324/72.5; 339/108 TP

[56] References Cited

U.S. PATENT DOCUMENTS

| | | | |
|---|---|---|---|
| 3,562,643 | 2/1971 | Smith | 324/72.5 |
| 3,906,363 | 9/1975 | Fowler | 324/158 F |
| 4,352,061 | 9/1982 | Matrone | 324/73 PC X |
| 4,357,062 | 11/1982 | Everett | 324/73 PC X |
| 4,535,536 | 8/1985 | Wyss | 324/158 F X |

FOREIGN PATENT DOCUMENTS

| | | | |
|---|---|---|---|
| 26824 | 4/1981 | European Pat. Off. | |
| 144682 | 6/1985 | European Pat. Off. | |
| 2707900 | 8/1978 | Fed. Rep. of Germany | |
| 2920226 | 11/1980 | Fed. Rep. of Germany | 324/158 F |
| 3115787 | 11/1982 | Fed. Rep. of Germany | 324/158 P |
| 3312436 | 5/1984 | Fed. Rep. of Germany | 324/158 P |
| 647899 | 2/1979 | U.S.S.R. | 324/73 PC |
| 2085673 | 4/1982 | United Kingdom | |
| 2086670 | 5/1982 | United Kingdom | 324/158 F |

OTHER PUBLICATIONS

DIT-MCO Technical Bulletin, Oct. 1976, "Formed Pin Transition Board".

*Primary Examiner*—Reinhard J. Eisenzopf
*Assistant Examiner*—Stephen M. Baker
*Attorney, Agent, or Firm*—Wolf, Greenfield & Sack

[57] ABSTRACT

An automatic fixturing system for printed circuit board testing including a magazine for temporarily storing probes, and a test head adapted to receive selected ones of the probes and position the probes in a pattern matching test points on the printed circuit board. The test head is supported adjacent to the magazine so that selected ones of the probes may be transferred. A base member is positioned adjacent the test head on one side thereof in a position to contact the base of each probe, and the printed circuit board is supported adjacent the test head with the head of each probe adapted to contact a test point on the printed circuit board. The test head includes a probe plate and a base plate positioned in parallel and separated by a spacing substantially the same as the probe length. Separate injector rods are provided for transferring individual probes to the test head. During the transfer, the probe plate is moved in its own plane relative to the base plate so that one or more probe plate apertures may at any given time be momentarily aligned with their corresponding pre-assigned base plate apertures and with the corresponding probe locations in the adjacent magazine, along axes perpendicular to the probe and base plates, so as to permit transfer of the corresponding probes in a straight line between the magazine and test head.

66 Claims, 15 Drawing Sheets

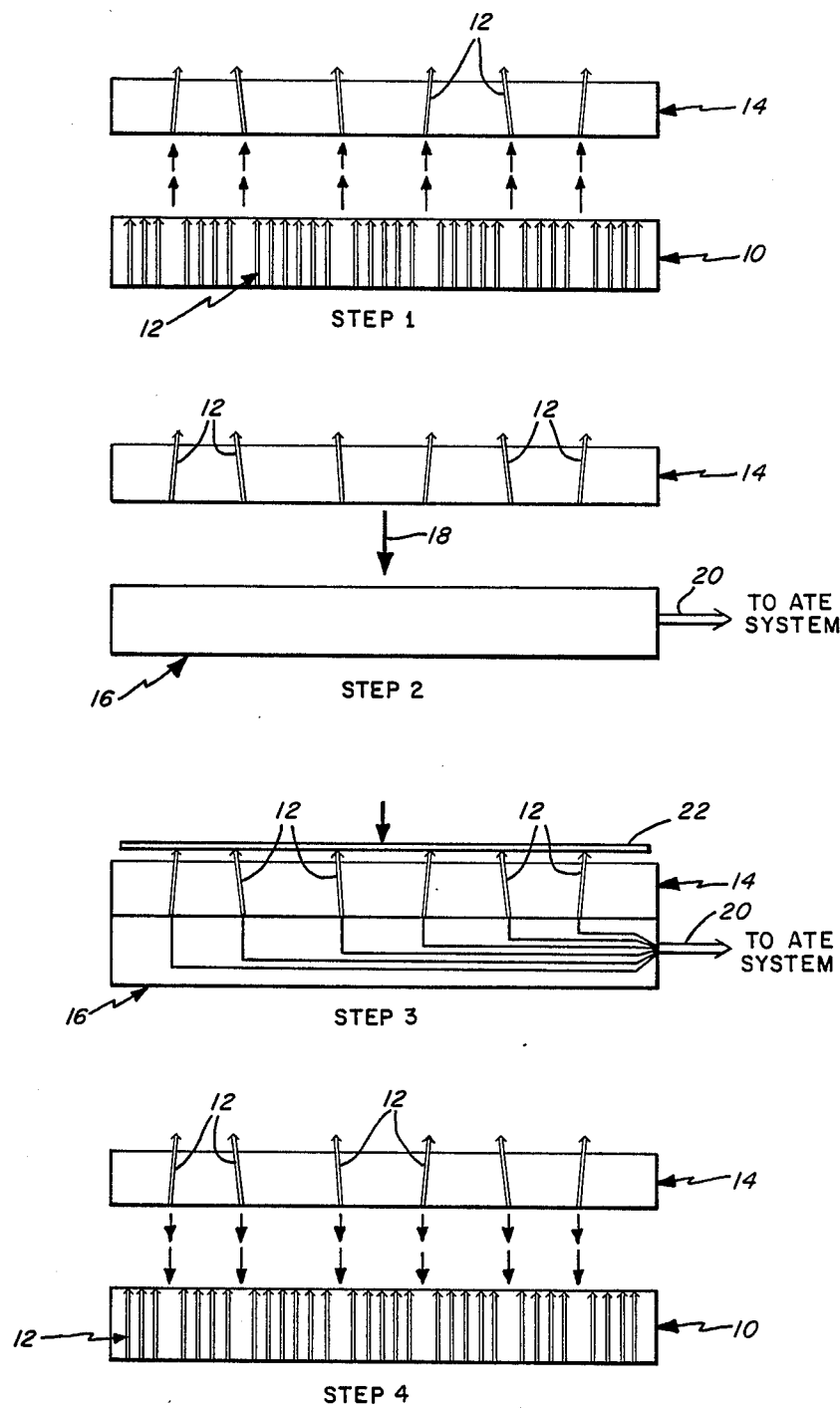

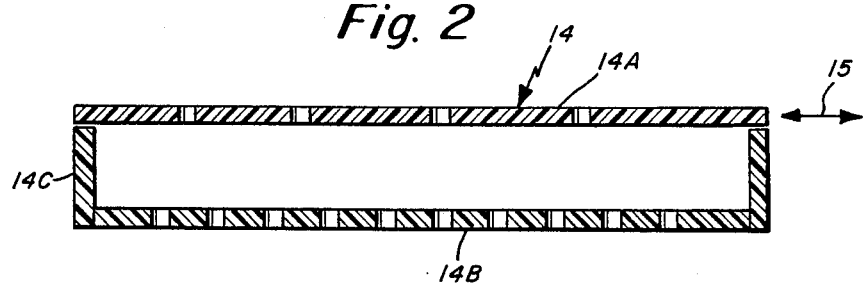
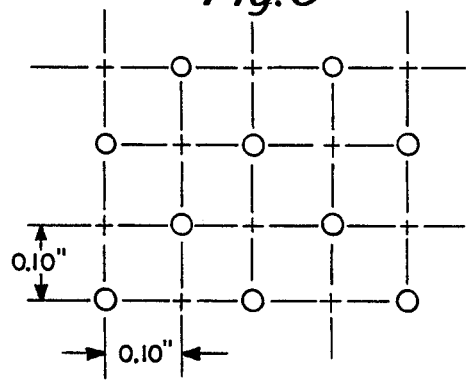
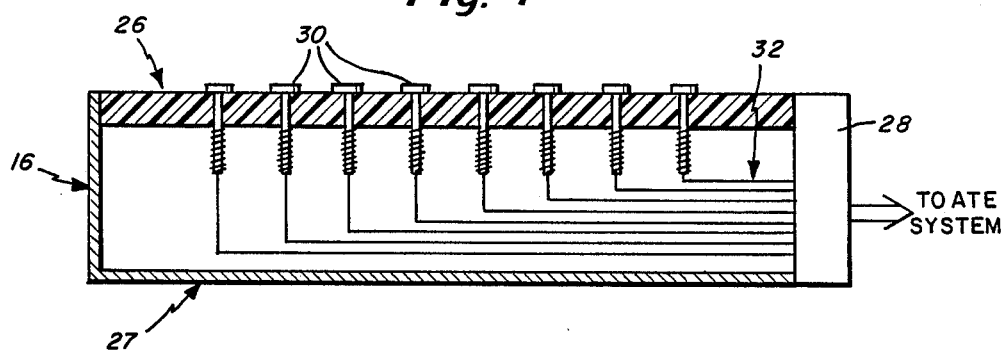

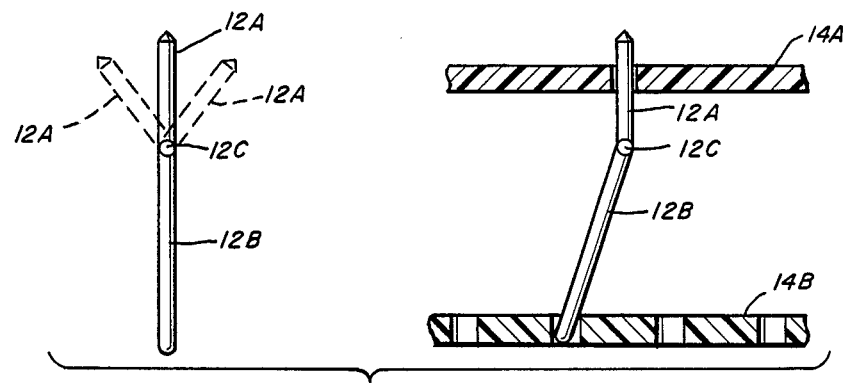
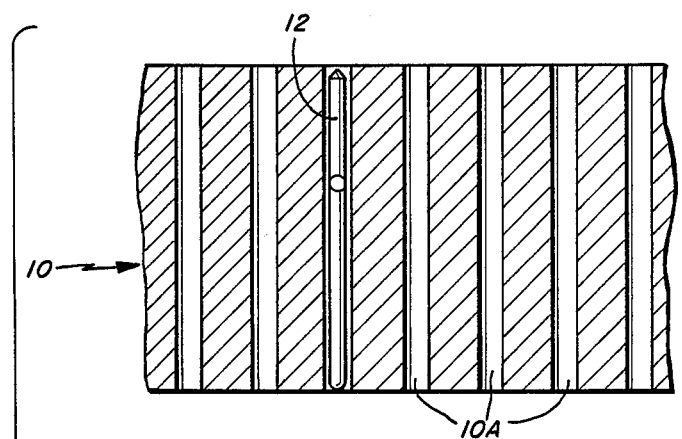
Fig. 7
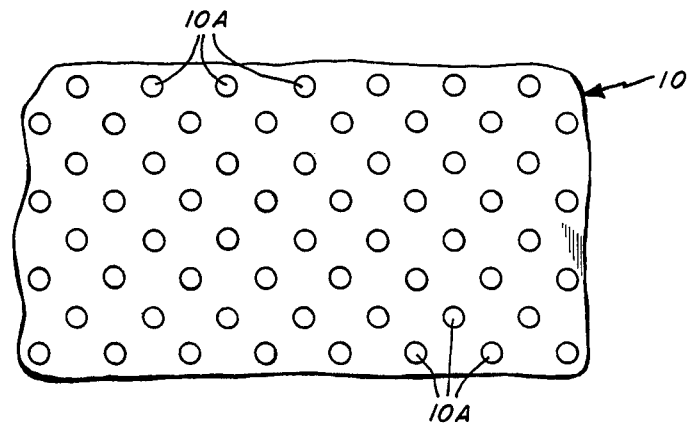
Fig. 8

● TEST POINT
○ BASE POINTS

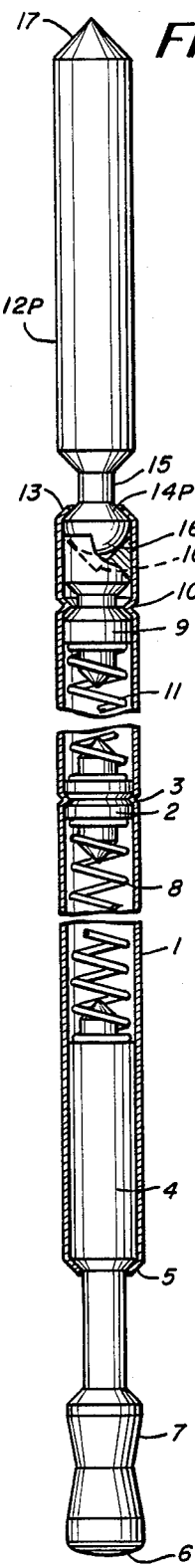
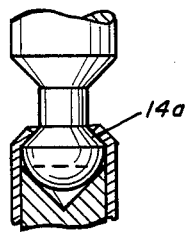
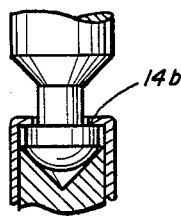
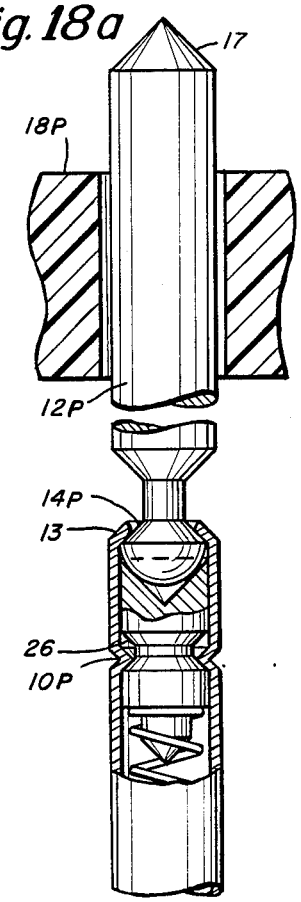
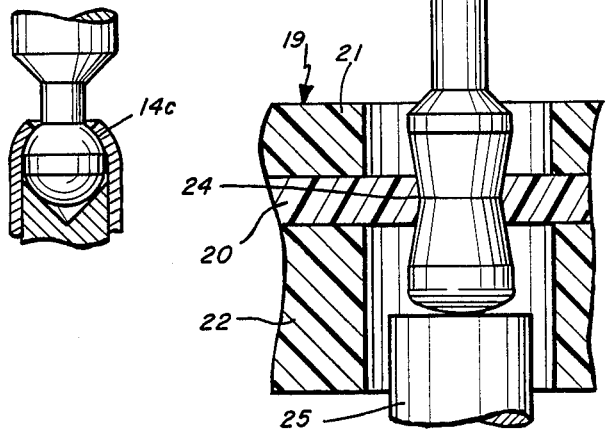

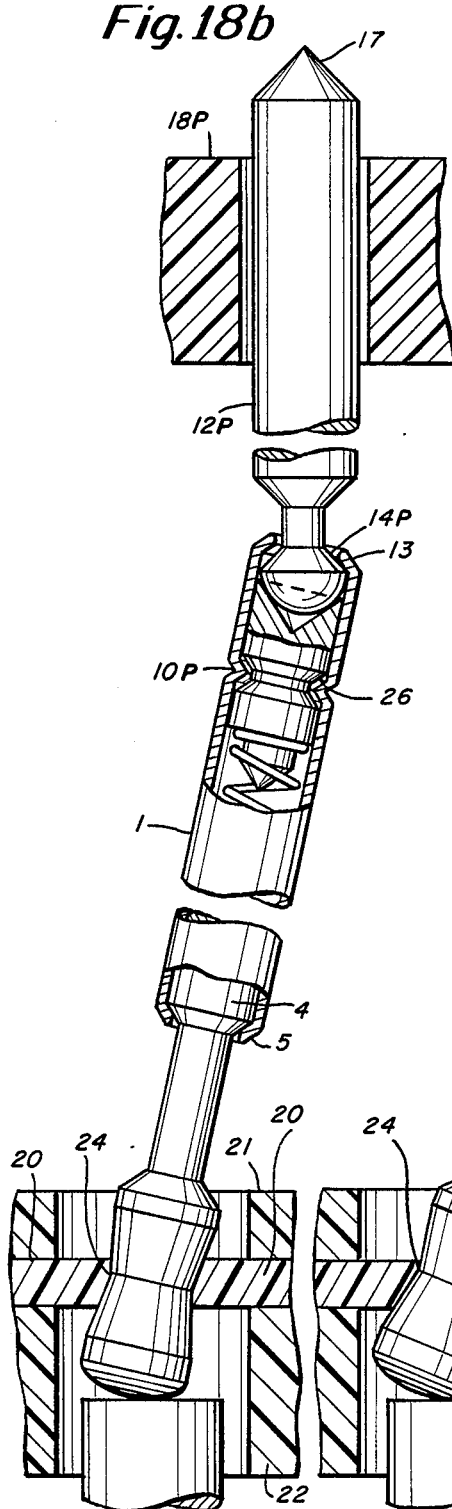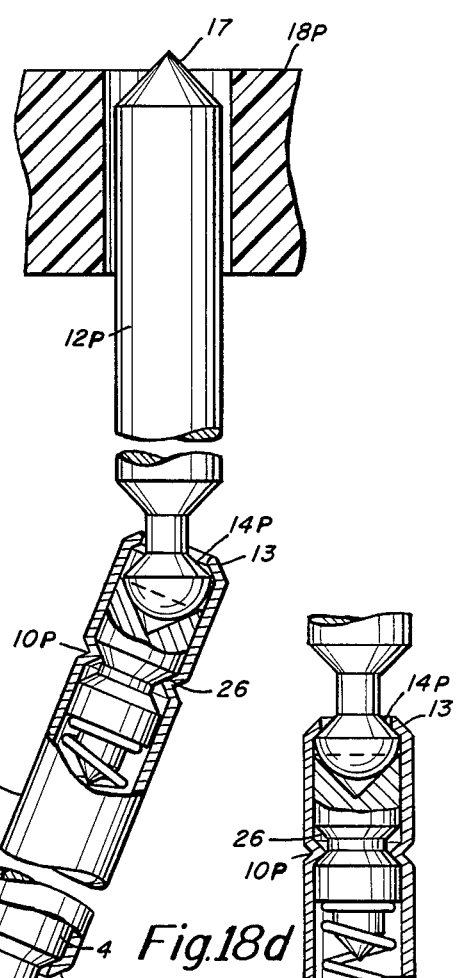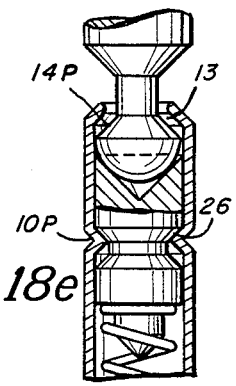
Fig.18b
Fig.18c
Fig.18d
Fig.18e

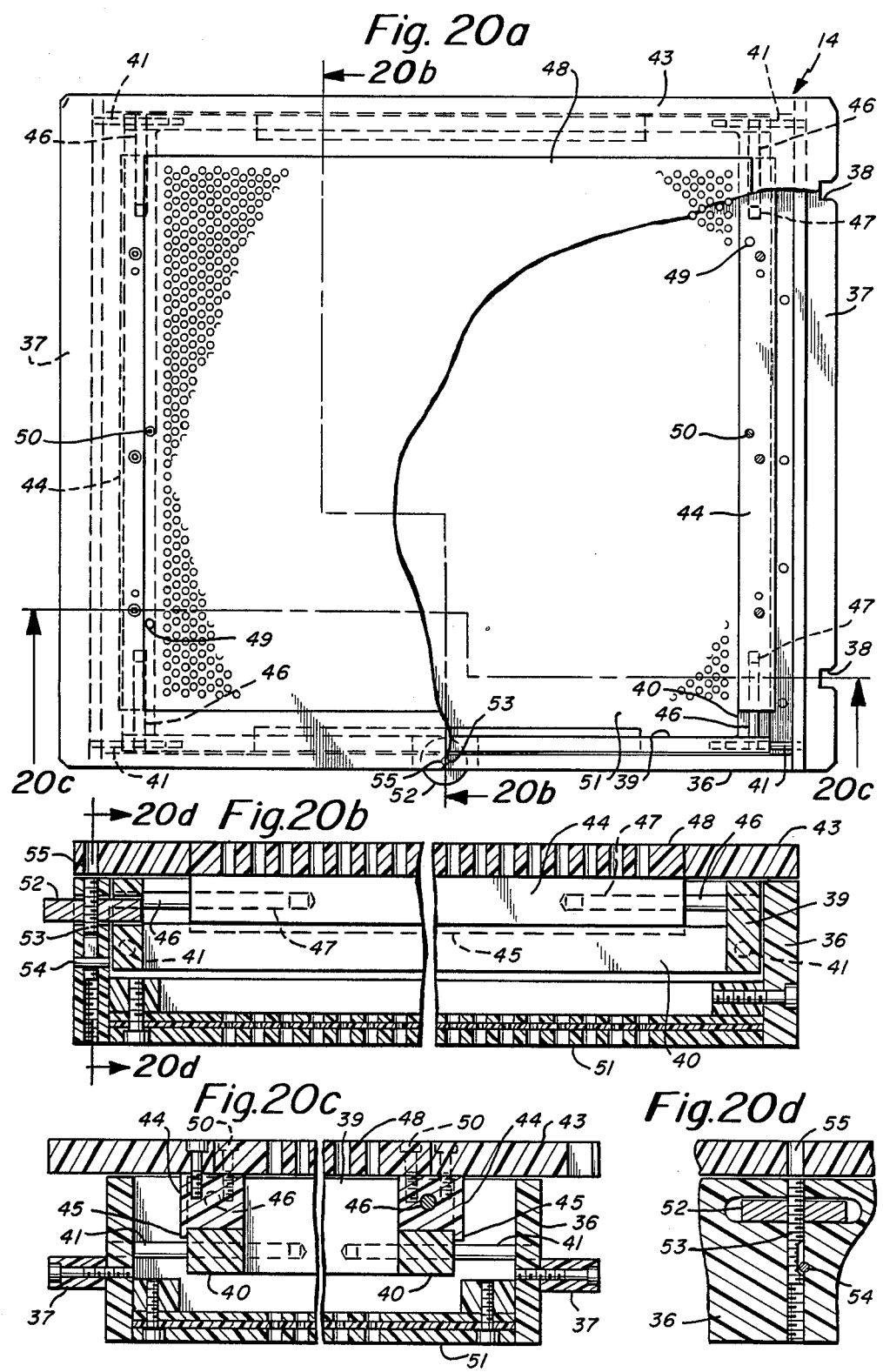

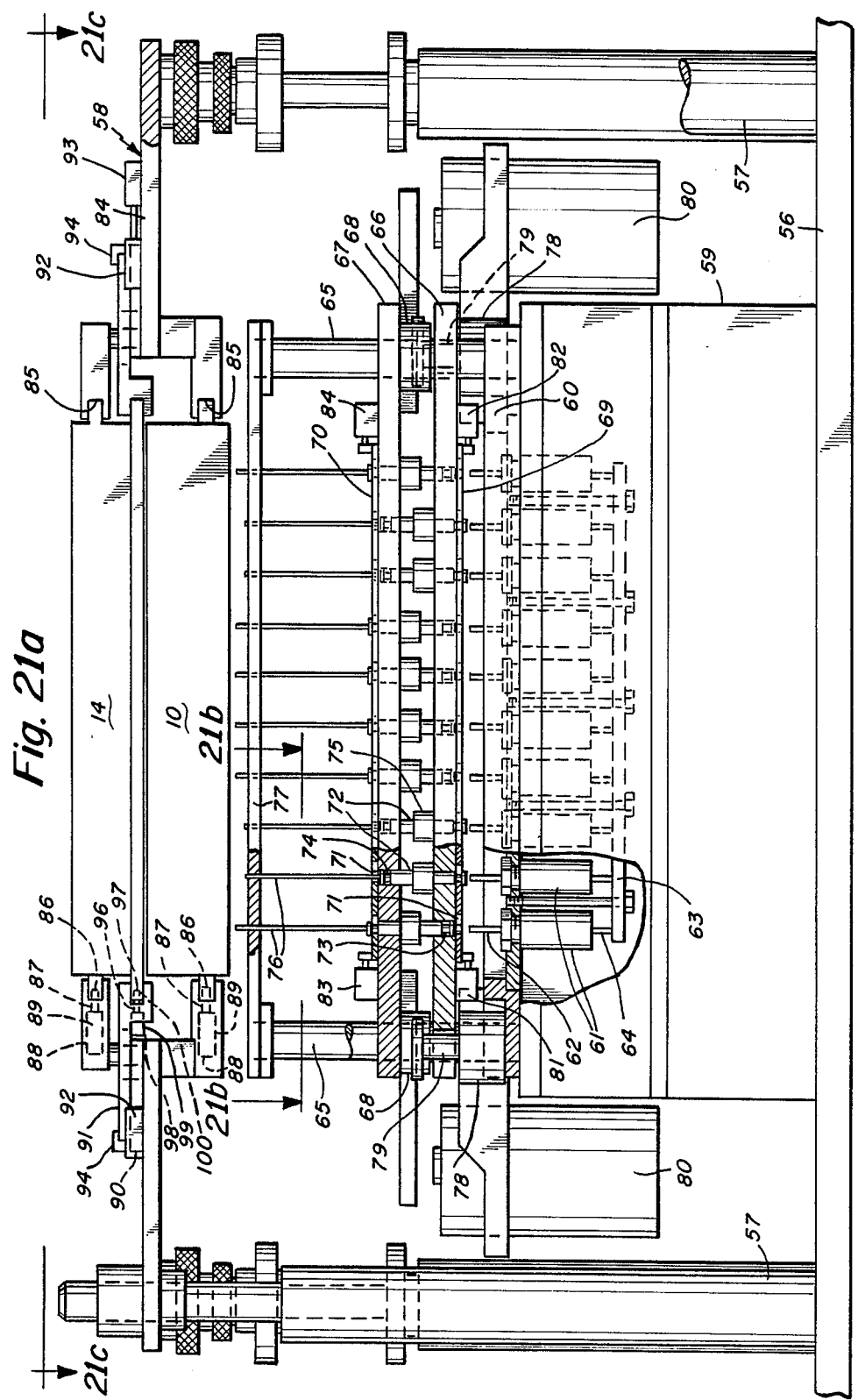

AUTOMATIC TEST SYSTEM

BACKGROUND OF THE INVENTION

The present invention relates in general to an automatic test system or apparatus and pertains, more particularly, to a novel automatic fixturing system for printed circuit board testing.

It is common practice in the electronics industry to subject printed circuit boards and their assemblies to various types of electrical tests to ensure quality and reliability. These tests include both the continuity testing of bare (unloaded) boards to detect unwanted open circuits and short circuits, and loaded board testing of completed printed circuit board assemblies to ensure the correct functioning of electronic components loaded on the board. In either case, testing is accomplished by means of automatic test equipment (ATE) which generally comprises means for applying suitable electrical stimuli (inputs) to appropriate test points on the printed circuit board and for measuring the resulting signals (outputs) from other selected test points. In particular, electrical connections between the selected test ponts on the printed circuit board and the input/output terminals of the ATE system are accomplished by means of ATE fixtures or fixturing systems.

Typically, an ATE fixture incorporates a 'bed of nails' comprising a parallel array of spring-loaded test probes carried in probe receptacles which are secured in a probe plate in a geometrical pattern precisely matching, in distribution and number, the selected test point sites on the printed circuit board. The lower extremities of the probe receptacles are wired individually to a suitable interface connector by which means electrical connection is made between the individual probes and the input/output terminals of the appropriate ATE system. Printed circuit boards to be tested are inserted individually in the fixture with the test points carefully aligned with the test probe array. The printed circuit board is then forced against the test probe array by mechanical, hydraulic, pneumatic or vacuum-operated means so that the spring-loaded probes are compressed and suitable electrical connection is made between each test point and the head of the corresponding probe, which typically incorporates a sharpened tip or multiple points to penetrate the solder run at the test point location. Transmission of stimuli and resultant signals between the ATE system and the printed circuit board under test is thus made possible by the fixture.

Because of the generally unique nature of the test-point pattern on a given printed circuit board type, a new and different fixture is usually required for each and every different printed circuit board type tested. Since a typical user of ATE equipment may have to test many types of circuit boards each year, conventional fixtures of the type described above have three serious disadvantages, namely:

(1) Cost—a typical fixture can cost from several thousand to several tens of thousands of dollars and has little or no scrap value once testing of its printed circuit board type is completed;
(2) Time to Fabricate—typical delivery times range from 2 to 6 weeks which can often result in delay of production schedules;
(3) Storage Requirements—the typical conventional fixture is bulky and requires considerable storage space when not in use;
(4) Handling Requirements—the bulk and weight of the typical fixture poses significant handling problems for test personnel.

The foregoing problems associated with conventional fixturing have long been recognized in the industry and have spurred efforts to develop a universal fixturing system that would accommodate all, or at least a very wide range of printed circuit board types with virtually no requirement for individual dedicated hardware for each separate printed circuit board type. Several different types of universal of quasi-universal fixtures hve indeed been developed as described briefly below.

One fixture is a universal grid matrix. This system relies on the fact that many printed circuit boards are laid out so that all component holes (which accommodate component leads) and hence all potential test points lie on a regular grid matrix (typically an 0.01" grid). For the class of such boards, fixturing can obviously be effected by means of a corresponding grid matrix array of test probes (typically incorporating 100 test probes per square inch on an 0.01" grid spacing) secured in a probe plate and permanently wired to the ATE system via the fixture interface connector. Hardware or software masking is generally provided to insulate or eliminate from consideration those probes which do not coincide with test points on the particular printed circuit board under test.

Universal fixtures of this type suffer generally from four major drawbacks as follows:

(a) Since all the test probes in the base matrix must be compressed regardless of the number of 'active' probes actually required in a given case, very large forces are required to operate the fixture. As a result, the fixture structure must be very strong (and hence bulky) and, in particular, vacuum-operation (which is generally the simplest and least expensive option) is ruled out;
(b) A large-capacity ATE system must be dedicated to service the fixture (typically, 100 input/output terminals must be dedicated to each square inch of test area in the fixture). This requirement specifically eliminates the potential application of the fixture to loaded board testing for which ATE system capacity is generally extremely limited;
(c) By definition, the fixture cannot be used to test boards on which all of the test points do not lie on a grid matrix of standard dimensions;
(d) While the cost of dedicated hardware (i.e. hardware peculiar to each different type of printed circuit board) is essentially eliminated, the capital cost of the fixturing system is substantial by virtue of the size and strength of its structure and the cost of the large number of test probes which must be permanently installed in it, regardless of the quantity actually involved in a specific test. Moreover, substantial additional cost is involved in the large-capacity ATE system which must necessarily be dedicated to the fixture (see (b) above).

Another type of fixturing system may be referred to as a universal grid with electrical/mechanical probe activation. This device is a development of the basic grid matrix above in which (typically) a special programming card (specific for each different printed circuit board type) is used to mechanically and electrically activate those and only those test probes within the total grid array, which are actually required for the test in progress. While this eliminates the need to compress the entire array (problem (a) in (1) above) the need for the relatively expensive dedicated programming cards degrades the original universality of the system.

Another system is referred to as a universal grid matrix with offset probe head. The concept of the offset probe was introduced essentially to expand the application of the universal fixture to printed circuit boards on which all of the test points do not lie on a standard grid. The offest probe is typically designed so that it can be bent, flexed or inclined away from its original axis to provide a small amount of lateral offset (typically up to 0.07") between its upper extremity (tip) and its lower extremity (base) when inserted in a special offset probe head. The offset probe head, which must be specially designed for a specific printed circuit board, incorporates an array of such probes so distributed and inclined, bent or flexed that their lower, (base) extremities conform to the universal grid matrix while their upper, (tip) extremities conform precisely with the desired pattern of test points on the printed circuit board. Thus, when the offset probe head is suitably inserted between the universal grid matrix and the printed circuit board under test, electrical continuity is established between the test points and the ATE system via the offset probes and their corresponding counterparts within the basic grid matrix.

In order to minimize the recurring dedicated cost re-introduced by the offset probe head, this head is typically constructed of two low-cost plastic plates. The upper probe plate is drilled in the required test point pattern, while the lower (base) plate is drilled in a grid pattern corresponding to the universal grid matrix. In the most common embodiment, straight probes are manually inserted in groups through the test holes in the upper plate and allowed to drop so that their lower extremities become located in laterally-adjacent base holes in the lower plate.

The offset probe head concept extends the application of the universal grid fixture to printed circuit boards whose test points do not conform to any standard grid matrix. The concept suffers from several disadvantages besides the (albeit low) cost of the offset probe heads.

(a) Manual assembly of the offset probe head is time-consuming, particularly in the case of large fixtures incorporating several thousand probes;

(b) Each time an offset probe for a specific printed circuit board is broken down (in order to re-use the offset probes in a different test) and subsequently re-assembled the offset probes will generally acquire new (different) locations in the lower base matrix, due to the somewhat arbitrary nature of the insertion process. Consequently, the test points will be interconnected to a different set of ATE input/output terminals so that the ATE system must be re-calibrated in order to identify faults detected during testing with specific localities on the printed circuit boards under test.

Still another fixture system is referred to as a universal base matrix with offset probes. This type of fixture utilizes the offset probe head of the previous system but dispenses with the original universal grid matrix of probes. In this case, the offset probes within the head interface directly with a grid matrix of fixed contacts which are wired directly to the interface connector. Thus, instead of being an optional addendum to the universal grid fixture to extend its application to printed circuit boards with off-grid test points, the offset probe head, in this case, is an integral part of the fixture and is used in testing a types of printed circuit board, including those which are laid out on a universal grid. In prctice, it provides similar advantages and suffers similar drawbacks to those indicated for the previous system.

Apart from the specific individual disadvantages of each type of the four universal fixturing systems described above, it should be noted that all of these systems are generally unsuitable for loaded board testing for two reasons, namely:

(1) As noted earlier, they require a very large ATE system capacity (typically, 100 input/output terminals per square inch of test area) which is generally not available on loaded board test systems;

(2) Unlike the simple continuity testing required for bare (unloaded) boards, loaded board testing involves the use of several different classes of input/output lines (e.g. power busses, analog and digital signal lines of various types, ground lines, etc.) Clearly, none of the universal fixturing systems outlined above provides any means for differentiating between these various types of test requirements and, hence, for ensuring the correct interfacing for each test point with the appropriate type of input/output terminal on the ATE system.

OBJECTS OF THE INVENTION

Accordingly, it is an object of the present invention to provide an improved automatic test system and in particular a novel automatic fixturing system for printed circuit board testing.

Another object of the present invention is to provide automatic means for rapidly assembling and configuring ATE fixtures for use in testing printed circuit boards, and for subsequently disassembling said fixtures so that the components thereof, including the test probes, can be reused repeatedly in a series of different fixture configurations.

Another object of the present invention is to provide a machine-insertable offset test probe which will permit automatic assembly and configuration of said fixtures and which can be reused repeatedly in a series of different fixture configurations.

Another object of the present invention is to provide a flexible probe capable of significantly greater maximum lateral offset than existing offset probes, thereby permitting a wide range of alternative orientations of the probe within the offset fixture.

Yet another object of the present invention is to provide means for controlling said fixture assembly process by computer so that the specific orientation of each offset probe within the assembled fixture can be selected from said alternative orientations according to a special software program so as to optimize the application of the fixture in testing printed circuit boards.

Yet another object of the present invention is to provide a universal fixturing system for testing unloaded printed circuit boards which requires a minimum number of ATE terminals per unit test area to be dedicated to it.

Yet another object of the present invention is to provide a universal fixturing system for testing unloaded printed circuit boards which requires a minimum number of ATE terminals per unit test area to be dedicated to it and which will provide each and every test point with access to any one of a variety of different types of input/output terminals on the ATE system so that the specific electrical requirements for loaded board testing can be satisfied in each and every case.

Yet another object of the present invention is to provide a total computer-integrated test system for both loaded and unloaded printed circuit boards in which test strategy development, fixture assembly and configuration and board testing can be accomplished under the control of a single internal or external host computer.

SUMMARY OF THE INVENTION

To accomplish the foregoing an other objects, features and advantages of the invention, there is provided an automatic fixturing system for the testing of printed circuit boards. The system of the invention comprises a magazine for temporarily storing a plurality of probes therein, a test head adapted to receive selected ones of the probes and a base receiver member positioned adjacent to the test head on one side thereof and in a position to contact the base of each probe. The test head is adapted to receive the probes and position the probes in a pattern matching test points on the printed circuit board. Means are provided for supporting the test head adjacent to the magazine and in a position to receive probes from the magazine. Means are also provided for transferring selected ones of the probes from the magazine to the test head. The printer circuit board is supported adjacent the test head on an opposite side thereof to the base receiver with the head of each probe adapted to be in intimate contact with a test point on a printed circuit board. The test head preferrably comprises a probe plate and a base plate with the probe and base plates being positioned substantially in parallel and separated by a spacing therebetween comparable to the length of each probe. The probe plate is disposed adjacent to the printer circuit board and a base plate is disposed adjacent to the base receiver. The probes are transferred in multiple groups with the probe plate being laterally displaceable relative to the base plate to align holes in the base plate with holes in the probe plate. The holes in the base plate are disposed in a square matrix grid while the holes in the probe plate are disposed in a test pattern arrangement. The means that are provided for transferring the probes includes injector means. This injector means may comprise a plurality of injector rods disposed in a matrix corresponding to the position of probes in the magazine. The base member may comprise a housing having a base plate supporting a plurality of contact elements supported therein. The contact elements are disposed in an array corresponding positionally to the probe bases. The base receiver member carries contact elements disposed in an array corresponding positionally to the holes in the test head base plate.

More particularly, in a preferred embodiment in accordance with the invention, the system is a computer-controlled universal fixturing system which incorporates a number of improved features as now set forth. In accordance with one feature of the present invention, there is provided an improved probe construction. This probe construction is in the form of a machine-configurable offset probe head. In this regard, the offset probe is preferably of articulated construction which permits much greater lateral offset than with conventional offset probes. Also, in accordance with the invention the offset probe is automatically inserted into and subsequently extracted from the offset fixture and may be reused repeatedly in a series of different fixture configurations. In accordance with another feature of the present invention, there is provided in the automatic fixturing system, a probe magazine that is designed to hold and retain the offset probes when they are not in use. This probe magazine is also adapted to be operated so as to permit automatic extraction of the probes therefrom and subsequent reinsertion therein. In accordance with still a further feature of the present invention, there is provided a fixture assembler mechanism which, under computer control, is capable of automatically loading probes from the magazine into the fixture in a configuration suitable for testing a specified printed circuit board; and subsequently unloading the probes from the fixture back into the magazine on completion of testing. With this arrangement, the loading and unloading are accomplished typically within a few minutes. In accordance with another feature of the invention, there is provided, as mentioned previously, computer control of the system. The computer control, with the aid of unique software, determines the precise manner in which the fixture is to be configured with the probes in order to permit testing of a specified printed circuit board type, and which, with the aid of certain other software, controls the assembler in the process of loading and subsequently unloading the fixture in this manner. So a further feature is related to a base receiver which is designed to accept and accommodate configured (assembled) fixtures mechanically and electrically thereby providing a direct electrical connection between each probe in the fixture and a suitable input/output terminal on the ATE system via an interface connector located in the receiver. The receiver is wired internally in a unique and novel manner which, in the case of bare board testing, significantly reduces the total number of input/output terminals dedicated to the fixturing system; and furthermore permits application of the system to loaded board testing by providing each and every test point with access to any one of a number of different types of input/output terminals on the ATE system. The receiver also incorporates mechanical, pneumatic, hydraulic or vacuum-operated means for compressing the printed circuit board under test against the probe array.

BRIEF DESCRIPTION OF THE DRAWINGS

Numerous other objects, features and advantages of the invention should now become apparent upon a reading of the following detailed description taken in conjunction with the accompanying drawings, in which:

FIG. 1 is a schematic diagram illustrating some of the basic concepts of the present invention illustrating the basic components thereof including the magazine, a test head, probes, and base receiver;

FIG. 2 is a schematic diagram of the system test head;

FIG. 3 shows a typical base plate hold pattern for bare board testing;

FIG. 4 is a schematic diagram of the base receiver member used in the system of the invention;

FIG. 7 illustrates an articulated probe as in accordance with the present inventon;

FIG. 8 schematically illustrates the construction of the probe magazine illustrating one probe in position;

FIG. 17 is a more detailed sectional view of the articulated probe which is the preferred embodiment of the offset probe in accordance with the invention;

FIG. 18 illustrates multiple positions of the articulated probe in accordance with the invention showing different angles of offset;

FIG. 20 illustrates further details of a preferred test head in accordance with the invention.

DETAILED DESCRIPTION

Figure 5:
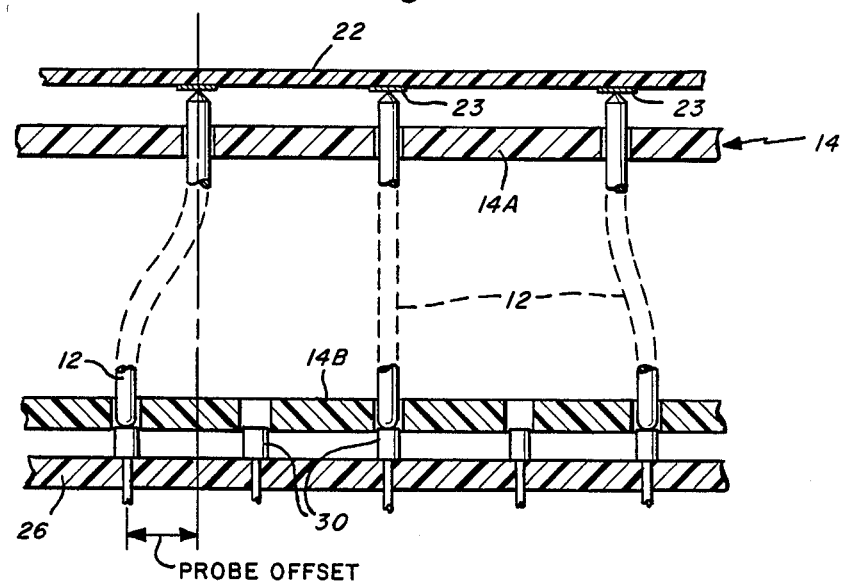
FIG. 5 is a schematic diagram of the test head, printer circuit board and a portion of the base receiver illustrating the offset probe of operation.

Referring now to the drawings, and in particular to FIG. 1, there are shown a series of steps that illustrate at least some of the basic concepts of this invention. In this regard, the configuration and assembly of a fixture which is dedicated to a particular printed circuit board is accomplished in accordance with the invention through the automatic, high speed transfer of offset probes from a probe magazine in which the probes are stored when not in use to an offset probe test head of unique construction. Thus, in FIG. 1, step one shows the magazine 10 supporting a plurality of offset probes 12. The step one also shows the offset probe test head 14 with representative ones of the probes 12 supported therein. Thus, step one refers to the automatic transfer of selected probes 12 from the magazine 10 to the test head 14.

The loaded offset probe head 14 is then inserted by automatic or manual means to be described in further detail hereinafter, into a base receiver 16 to thus provide in combination therewith, a complete test fixture suitable for interfacing printed circuit boards of the selected type with the appropriate test equipment. It is noted in step two in FIG. 1 that the test head 14 is illustrated by arrow 18 as being inserted into the base receiver 16. The step two also shows the wiring interface 20 which will enable connection to the ATE system.

In FIG. 1 the step three illustrates the testing of the printed circuit board in the assembled fixture. In step three it is noted that the test head 14 has been inserted into the base receiver 16. Step three also illustrates the printed circuit board 22 that is under test.

Upon completion of testing of the particular type of board, the offset probe head 14 is removed from the base receiver 16 either by automatic or manual means. The probes within the head are then transferred back into the magazine 10 again by automatic, high speed means for subsequent re-use in testing other types of printed circuit boards. In FIG. 1 the step four illustrates the automatic return of probes 12 from the test head 14 to the magazine 10.

A simplified representation of the offset probe head is illustrated in FIG. 2. Essentially, the head 14 is comprised of two parallel plates 14A and 14B positioned a short distance apart (typically one to two inches apart) within a bounding rectangular frame 14C. The lower base plate 14B is drilled or otherwise perforated with a matrix of holes in a regular pattern of which the pattern of FIG. 3 is typical. It is noted in this pattern that the basic hole matrix is with a spacing of 0.10 inch. The base plate 14B is rigidly attached to the frame 14C and incorporates means to be described in detail hereinafter for retaining probes inserted into the test head. The upper probe plate 14A is drilled with a pattern of holes which corresponds precisely with the pattern of test point locations on the printed circuit board. The upper plate 14A is also attached to the frame 14C in a manner that it is free to move a small distance in each of the two dimensions within its own plane, but otherwise being constrained relative to the frame 14C. The amount of travel permitted in each direction as indicated by the arrow 15 in FIG. 2 within its plane is on the order of several times the typical hole spacings in the base matrix pattern as illustrated in FIG. 3. Of course, the plate 14A being adapted for small distance movement also is capable of movement in addition to in the direction of arrow 15, also essentially in and out of the paper in the view of FIG. 2.

Reference may now be made to FIG. 4 which schematically illustrates the base receiver 16. The base receiver 16 comprises a flat plate 26 at the top of the housing 27. At the right side of the housing 27 as illustrated in FIG. 4 there is provided a schematically represented interface connector 28. In the plate 26 there are provided extending therethrough, a matrix of electrically-conducting studs or contacts 30 disposed in a pattern precisely matching the matrix of holes in the base plate 14B of the test head 14.

The design of the base receiver 16 is such that whenever the test head 14 is inserted into it, each and every hole in the base plate 14B is located directly over a corresponding stud 30 in the base receiver 16. Each contact stud 30 in the base receiver is wired to an interface connector 28 which in turn is connected point-for-point to the appropriate test system used in testing the printed circuit board. The contact studs are wired to the interface connector by means of the wiring 32 and are connected in a particular manner to be described in further detail hereinafter.

FIG. 5 illustrates a simplified representative of the offset probes 12 loaded within the test head 14. FIG. 5 also illustrates the printed circuit board 22 with its associated test points 23. FIG. 5 furthermore illustrates the top plate 26 of the base receiver with the electrically conducting studs or contacts 30 shown in position in alignment with holes in the base plate. Furthermore, some of these studs 30 are shown in contact with ones of the probes. The purpose of the probes is to provide electrical continuity between the test points on a printed circuit board applied and correctly registered against the pattern of drilled holes in the upper surface of the probe plate 14A and a corresponding number of contact studs in the base receiver top plate 26, thereby providing electrical contact with the input/output terminals of the test system via the aforementioned interface connector. Since, in general, the pattern of test point holes in the upper probe plate 14A will not match the regular pattern of holes in the lower base plate 14B, the probes loaded into the test head have to be capable of functioning in an offset position as illustrated in dotted in FIG. 5. In other words, this offset position is carried out with the upper extremity or head of the probe displaced laterally from the normal axis which lies through the lower extremity or base of the probe as illustrated in FIG. 5.

Figure 6A:
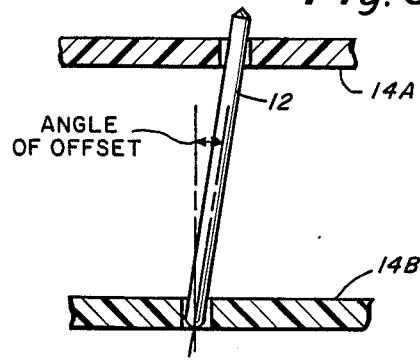
FIGS. 6A and 6B show a rigid offset probe and a flexible offset probe, respectively.
Figure 6B:
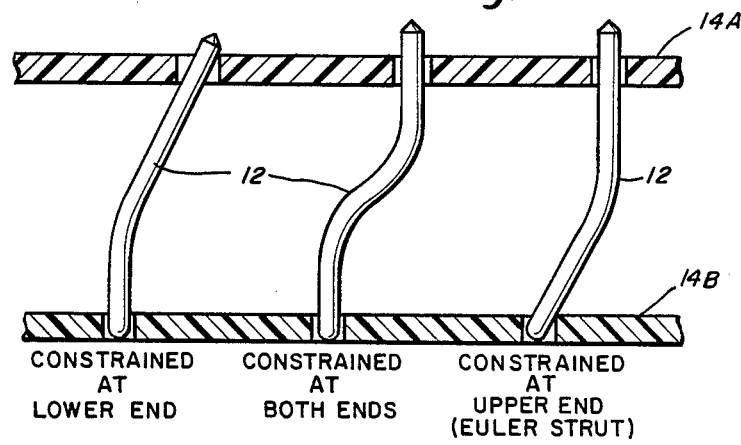

In principle, offset in the probe may be achieved in several different ways, as represented schematically in FIG. 6. FIG. 6A shows a straight, rigid offset probe which inclines to provide the required degree of offset. This type of probe is in common use in existing offset fixture systems. FIG. 6B shows several versions of a flexible offset probe in which part or all of the probe flexes appropriately to provide offset. While each of these different probe types could be employed in the present invention, they each have certain disadvantages in operation. The rigid offset probe is limited to small angles of offset FIG. 6A by the need to maintain the head of the probe nearly normal to the printed circuit board surface to avoid mis-registration between the probe tip, which is usually pointed, and the test point location on the board. Thus relatively large amounts of offset can only be attained through the use of a relatively long probe and hence a relatively thick and cumbersome test head. The same considerations apply to the first flexible probe concept of FIG. 6B in which the lower portion of the probe is constrained to remain normal to the base plane. The second flexible probe concept is one in which the probe is constrained at both ends. The third version of FIG. 6B is the so-called "euler strut probe" which is also used in some current types of offset probe fixtures. While this probe is suitable for applications in which relatively small degrees of offset are required, it presents practical design and manufacturing difficulties when applied in cases where relatively large amounts of offset are needed.

In accordance with the overall system concept of the invention, the probes illustrated in FIG. 6 may be employed. However, in accordance with the invention it is preferred to have an improved probe construction which is of articulated design. The articulated probe as represented schematically in FIG. 7 comprises two straight, rigid sections 12A and 12B joined by means of special articulated joint 12C which permits rotation of one section relative to the other section about a point within the joint. When loaded in the test head, the upper section of the probe is free to move axially in the test point hole drilled in the probe plate. The lower extremity (base) of the probe is located within a laterally proximate hole in the base plate. As mentioned earlier, the construction of the base plate is such as to lightly retain the probe within the test head once it has been inserted into it. Nevertheless, the nature of the retention is such as to permit subsequent mechanical extraction of the probe.

Reference may now be made to FIG. 8 which is a fragmentary view illustrating a portion of the probe magazine 10. The probe magazine typically comprises a rectangular structure with dimensions approximating those of the test head. As represented schematically in FIG. 8, the magazine incorporates a matrix of parallel tubular receptacles 10A which, in cross-sectional distribution, precisely matched the matrix pattern of holes in the base plate 14B of the test head 14. The construction of the magazine in general and the design of the tubular receptacles in particular, such as to accept and lightly retain the offset probes 12 upon their insertion into the magazine. It is noted in FIG. 8 that there is shown a vertical cross-section with one of the articulated probes 12 in positon. There is also shown a plan view showing the pattern of probe receptacles or probe holes precisely matched to the pattern of base holes on the test head.

Figure 9:
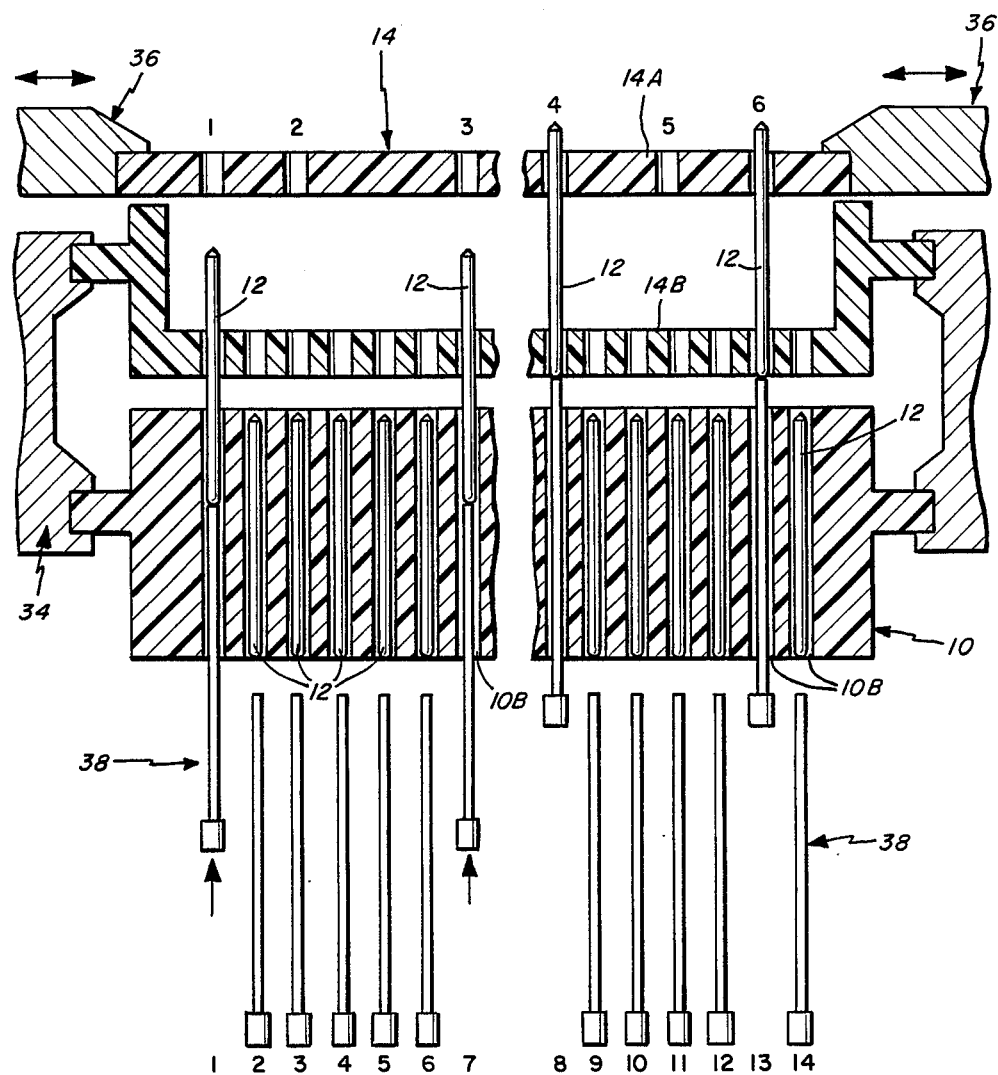
FIGS. 9A and 9B illustrate further details of the test head, magazine and transfer means illustrated as a plurality of ejector rods.

In order to assemble a fixture to permit testing of a specific printed circuit board, the probe plate 14A drilled in the prescribed test point pattern is first attached to the frame of the test head 14. The test head and a magazine 10 loaded with probes 12 are then inserted into the fixture assembler. Th fixture assembler as schematically illustrated in FIG. 9 comprises means 34 for rigidly securing the magazine 10 and the frame of the test head in close proximity so that the probes within the magazine are precisely aligned in the axial direction with the corresponding holes in the matching base plate matrix. Refer to the base plate 14B of FIG. 9. Also, additional means 36 are incorporated in the overall fixture assembler for retaining the probe plate 14A in a manner so that the plate 14A can be translated by the assembler mechanism under computer control, a smal distance in any direction within the plane of the probe plate 14A. Provision has been referred to previously for such motion.

The assembler further comprises a set of injector rods 38 which are axially aligned with the probe receptacles in the magazine 10 and located close to the magazine on the side opposite to the test head as clearly illustrated in FIG. 9. Means (not specifically illustrated in FIG. 9) are also provided for selecting and moving, under computer control, one or more of the injector rods 38 in a group so that they enter into the corresponding probe receptacles 10B thereby completely displacing the probes therein and causing the probes to move axially into the test fixture until they are positioned completely therein and preferaly lightly retained as referred to previously.

In order to permit total insertion into each probe into the test head, it is obviously necessary to momentarily align the appropriate test point hole in the probe plate 14A with the probe itself and with its corresponding base hole so that injection occurs entirely in a straight line. The momentary alignment is achieve by translating the probe plate 14A laterally by the required amount by means of the aforementioned movable probe plate retention mechanism 36. In this way the entire test head can be loaded with probes in a series of cyclic operations, with each cycle comprising:

(1) Lateral positioning of the probe plate 14A to momentarily align one or more of the test point holes in the probe plate with corresponding holes in the base plate 14B;
(2) Selection and activation of the corresponding set of injector rods 38 to transfer probes 12 from the magazine 10 into the aligned holes in the test head 14.

FIG. 9 is actually shown in two parts. At the left side the injector rods are shown displacing the probes out of the magazine 10 into the test head. The right hand side of FIG. 9 illustrates the probes in their final position in the test head. In this regard the probe head retention mechanism 36 is moved momentarily to align the test holes 1, 3, 4, and 6 with magazine receptacles and probes number 1, 7, 8, and 13. Subsequently, the activated injector rods are withdrawn and the probe plate may then be repositioned to align the next set of test holes for probe insertion.

FIG. 9 shows the magazine located on the base plate side of the test head for loading purposes. However in an alternate embodiment, it is also possible to load the test head from the probe plate side in which case the probes enter the test head base end first rather than head end first.

Following completion of testing of the printed circuit board with the assembled fixture, the fixture is disassembled in a reverse process in which the magazine and test head are first interposed and a similar cyclic process is used to transfer the utilized probes back from the test head into their original receptacles in the magazine. FIGS. 10 and 11 show two alternate methods of disassembly, each associated with two different methods of assembly. In one technique, both the magazine and the test head are rotated so that the probes are extracted in the reverse direction (relative to the test head) to that in which they were inserted. In the other technique, the magazine and test head are simply exchanged without rotation so that the probes are removed in the same direction (relative to the test head) as that in which they were inserted. The two alternative modes of assembly and the two alternative modes of disassembly thus provide a total of four alternative modes of assembly/disassembly.

Figure 10A:
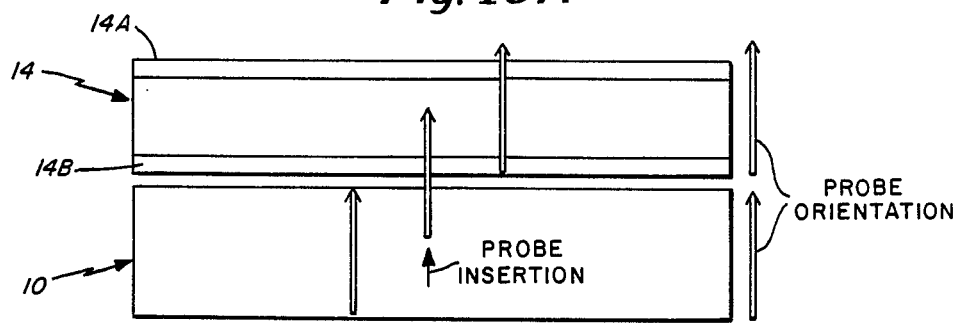
FIGS. 10A-10C schematically illustrate the manner in which probes are transferred between the magazine and test head.
Figure 10B:
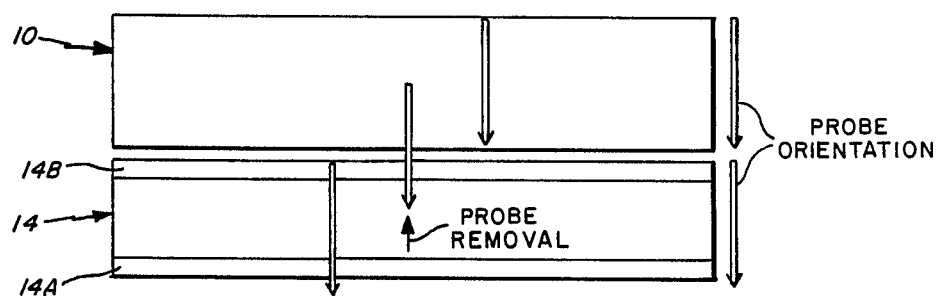
Figure 10C:
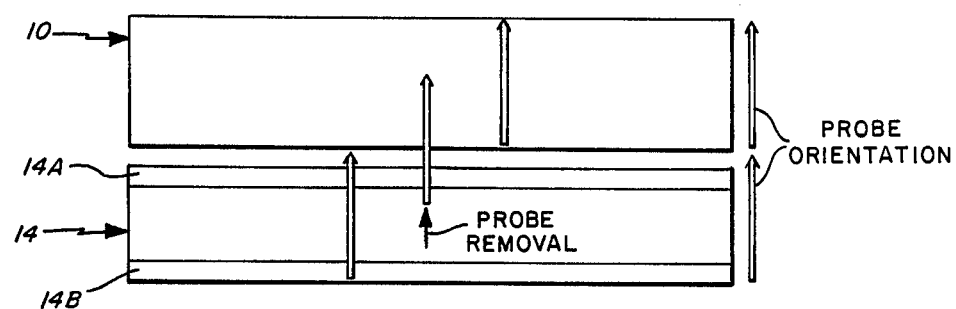

With reference to FIG. 10, in FIG. 10A it is noted that there is shown the test head above the magazine. FIG. 10A illustrates the upright test head assembly position in which the probes are extracted from the magazine into the test head. In FIG. 10B the probes are simply shown as being moved upwardly out of the test head and back into the magazine. This may be referred to as a reverse out disassembly position. Finally, in FIG. 10C the probes positioned in the test head are simply moved with the front end of the probe moving first into the magazine 10. This may be referred to as a straight through disassembly procedure.

Figure 11A:
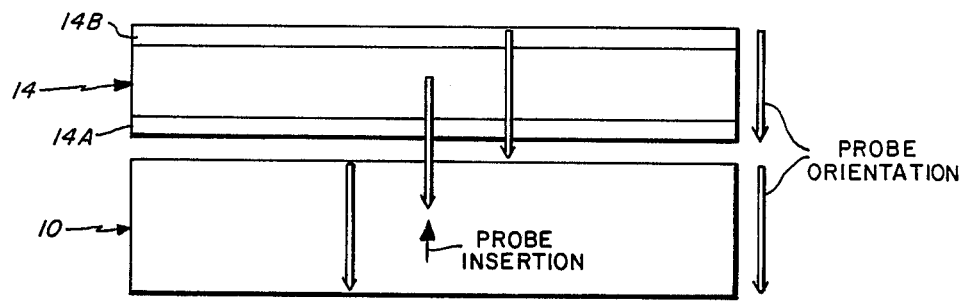
FIGS. 11A-11C schematically illustrate further diagrams concerned with probe transfer between the magazine and test head.
Figure 11B:
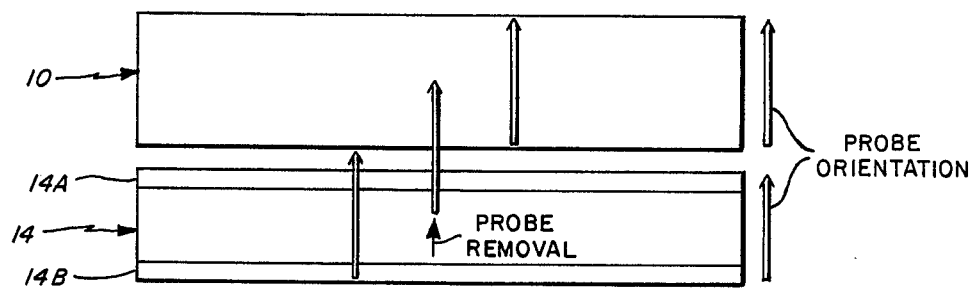
Figure 11C:
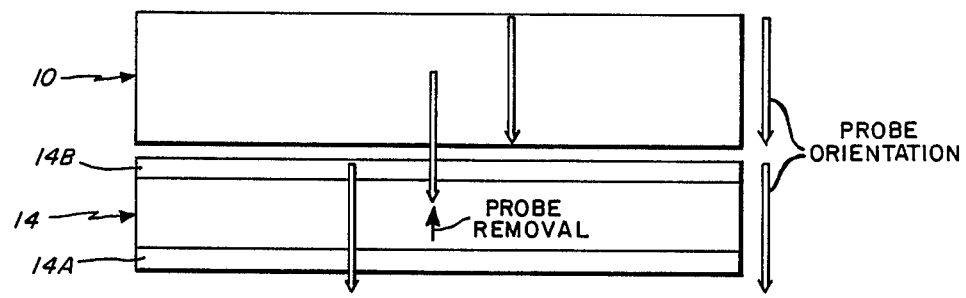

With regard to FIG. 11, in FIG. 11A the magazine is shown in its inverted position. The arrow in FIG. 11A indicates the reverse insertion of the probes into the test head. This may be referred to as an inverted test head assembly position. FIG. 11B shows the probe removal from the test head 14 back into the magazine 10. This may be referred to as a reverse out disassembly position. Finally, in FIG. 11C the probe removal from the test head is carried out by raising the probes into the magazine 10 with the base of the probes being inserted first into the magazine. This may be referred to as a straight through disassembly position.

In order to provide for satisfactory insertion into the test head, the offset probe that is utilized has to be capable of withstanding repeated inclination, flexing or articulation during the insertion process because after each probe is inserted in a straight line normal to the probe plate, the plate is subsequently moved laterally to permit insertion of additional groups of probes thereby generating different degrees of offset in the probes previously installed. The maximum amount of offset which any given probe may incur during the assembly or disassembly process may be as much as twice the maximum amount of offset which any probe may finally attain in the fully assembled test head in its test configuration.

It should further be apparent that the performance of the different types of offset probes during the aforedescribed assembly and disassembly operations may be significantly effected by the free geometry of the probe; that is to say by the particular geometric shape which the probe may or may not tend to adopt in the absence of offsetting forces. In this regard, the offset probes in general fall into four main categories in descending order of stiffness as follows:

(1) Rigid probe which remain straight under all conditions;
(2) Self-straightening probes which by virtue of certain elastic properties, offer a degree of resistance to offset and therefore tend to assume a straight geometry in the absence of offsetting forces;
(3) Self-constraining probes which offer a degree of resistance to change in offset and therefor tend to retain a given geometry in the absence of a relatively substantial offsetting force;
(4) Unconstrained probes which offer no resistance to any offsetting force.

It is desired to have relatively good stiffness in the probes from the standpoint of automatic handling during the assembly process. The articulated probe in accordance with one feature of the present invention can be designed and constructed either in a self-straightening, self-constrained, or unconstrained version, all of which may be employed in the overall concepts of the invention.

During testing of a printed circuit board, the probes within the test head are required to depress elastically in the axial direction as the board under test is applied against the probe plate, thereby developing a contact force between the head of the probe and the corresponding test point on the board and promoting good electrical conductivity. The elastic compression may be achieved as follows:

(1) Using an axially rigid (incompressible) probe in conjunction with an elastically compressible (spring-loaded) contact stud in the base receiver;
(2) Using an axially compressible (springloaded) probe in conjunction with a rigid contact stud;
(3) Using a combination of spring-loaded probe and spring-loaded contact stud.

Upon completion of the test head assembly process, as mentioned earlier, the test head is connected mechanically and electrically to the base receiver 16 in order to permit testing of printed circuit boards in the resultant fixture. To accomplish this connection, the loaded test head may be removed manually or automatically from the assembler mechanism and subsequently inserted into a physically remote base receiver. In this regard, in accordance with one feature of the invention, the lightweight, low-profile nature of the test head permits easy shipment to and from remotely located test equipment which incorporate appropriate base receivers, thereby permitting establishment of a unique fixturing service in which test heads can be rapidly assembled at a central location or locations and transmitted to remotely-located customers for use in their test programs. In this way the test heads can be subsequently returned upon completion of the test programs for rapid disassembly and re-use in other programs. Such physically-separate base receivers may incorporate a variety of means for applying the printed circuit boards against the test head during testing, including mechanical vacuum, pneumatic, and hydraulically operated means.

Alternatively, the base receiver 16 may be incorporated into the assembler mechanism to permit both test head assembly and disassembly and testing of boards within a single total enclosure. In such cases, it is possible to utilize the aforementioned probe injector mechanism as a means of applying the printed circuit boards against the test head during the testing phase as indicated schematically in FIG. 12. In this regard, note in FIG. 12 the plurality of injector rods 38 and associated pressure plate 40. The printed circuit board 22 is supported on the top of the pressure plate 40.

Figure 12:
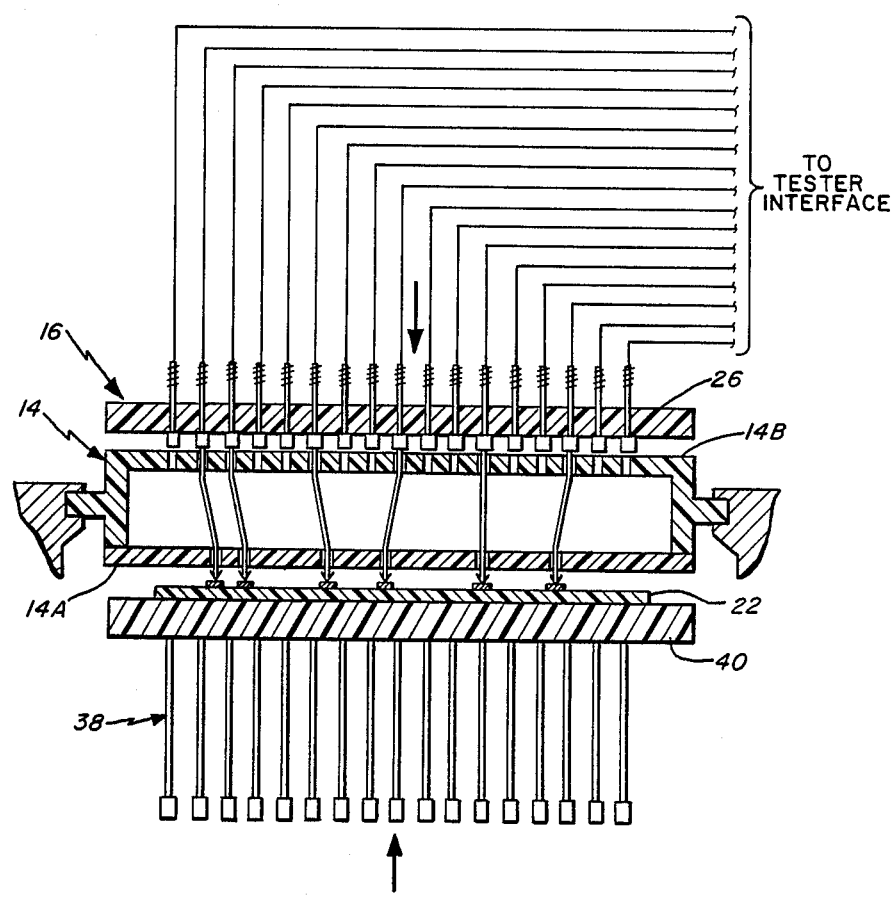
FIG. 12 illustrates the test head of the present invention in combination with a base receiver and printed circuit board wherein a printed circuit board is held in position with the use of a pressure plate and associated injector rods previously used for probe transfer.

In the configuration illustrated in FIG. 12, the loaded test head 14, which is loaded in the inverted position, is left in the assembly mechanism following completion of the assembly operation or while the magazine, located below the test head in this illustration, is removed therefrom. A base receiver plate 26 incorporating the base contact studs 30 is lowered a short distance by manual or automatic means so that the studs are brought into correct contact with the base extremities of the inverted probes within the test head. A pressure plate 40 of appropriate design is then placed directly above the probe injector rods 38 of the assembler mechanism within part of the space vacated by the magazine 10. The printed circuit boards to be tested are positioned one at a time directly above the pressure plate 40 and directly below and in correct registration with the probe plate 14A of the inverted test head 14. Actuation of the totality of the injector rods then raises the printed circuit board up against the probe heads as required for test purposes. Insertion and eventual removal of the pressure plate 40 and insertion and subsequent removal of each printed circuit board may each be effected by either manual or automatic means. In particular, a fully automatic mechanism for loading boards into the system and for subsequently removing and segregating them into "good" and "bad" boards (according to the results of the testing procedure) may be integrated with the assemblers/tester mechanisms to provide a totally automatic test system.

The overall test head assembly and disassembly processes are controlled by a computer of suitable capability which is required to perform two specific tasks:
(1) Design of the test head in regard to the positioning and orientation of the probes therein;
(2) Control of the various machine elements and drives which effect the required motions within the assembler mechanism.

The design of the test head probe configuration essentially involves the assignment of each probe injected into the head to a specific test point into a corresponding base point. The manner in which the probes are so assigned is important to the successful operation of the assembler into the subsequent performance of the loaded test head. The various considerations involved in the assignment process are discussed individually below.

First, each probe is to be assigned to a laterally proximate base point so that the lateral distance between the axes of the test point hole and base hole respectively when the probe plate is locked in the central test mode position (i.e. the operational offset) does not exceed one-half the maximum offset permitted mechanically by the probe. This ensures that the probe may be momentarily offset during the assembly and disassembly operations by an amount up to twice the operational offset, which requirement has been explained above.

Second, the probes are to be assigned to base points in such a way that they do not interfere mechanically with each other during the assembly or disassembly operations and, in particular, so that no two probes are in electrical contact with one another when the probe plate is locked in the central test mode position.

Third, in the case of bare (unloaded) board testing, it is highly desirable that the probes be assigned to specific base points consistent manner so that each and every points in a logical and consistent manner so that each and every time a particular test head is reassembled to permit testing of successive batches of a particular printed circuit board type, each probe will automatically be assigned to its original base point, thereby eliminating the need to successively recalibrate the test equipment in order to determine the correspondence between tester input/output terminmals and test point locations on the board.

Fourth, in the case of bare board testing, the ability to assign and consistently reassign a specific test point and its probe to one of a number of locally proximate and available base points uniquely permits a considerable reduction in the probe density required in the magazine (number of probes per unit test area) and a further considerable reduction in the tester capacity required to service a given test area as will be explained more fully below.

Fifth, in order to utilize the invention, for loaded board testing, it is desired that each test point probe be given the choice of a variety of base points, each of which is connected to a functionally different type of input/output terminal on the tester, so that each test point can be supplied individually with the correct stimulus from the test equipment or can transmit an output to the appropriate sensor within the test equipment without need to reconfigure the interface connector between the fixture and the test equipment. Furthermore, the facility to minimize the number of tester terminals required to service the fixture is vital in the case of loaded board testing where tester capacity is much more limited than in the case of bare board testing.

Sixth and finally, precise and consistent assignment of probes from the magazine to each different test head permits a substantially degree of monitoring of individual probe cycling and performance, particularly if the computer also has access to the number of test cycles which each assembled test head undergoes. Such monitoring makes possible a degree of preventative probe maintenance hitherto unattainable in conventional universal fixtures.

Figure 13:
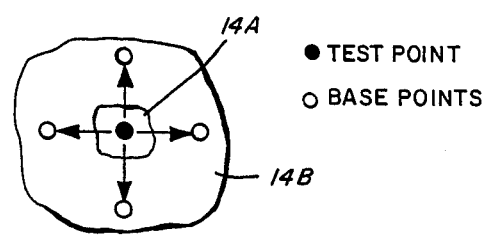
FIG. 13 illustrates the selection process performed by the computer of the system of the invention.

FIG. 13 illustrates the selection process performed by the computer wherein a specific test point in the probe plate 14A is assigned to a corresponding base point in the base plate 14B plane so that a particular probe subsequently injected into the test head will provide an electrical connection between said test point and said base point. FIG. 13 shows an enlarged plan view of a group of base points upon which is superimposed a test position. A circle centered at the test point and of radius equal to the maximum operational capability (i.e. one-half the mechanical offset capability) of the probe defines that group of base points which can be accessed by the test point. Obviously, the actual number of accessible base points in any particular embodiment of the invention will be a function of:

(1) The maximum operational offset of the probe type used;
(2) The base point density (number of base holes per unit area of base);
(3) The precise nature of the geometric pattern in which the base points are arranged.

Figure 14:
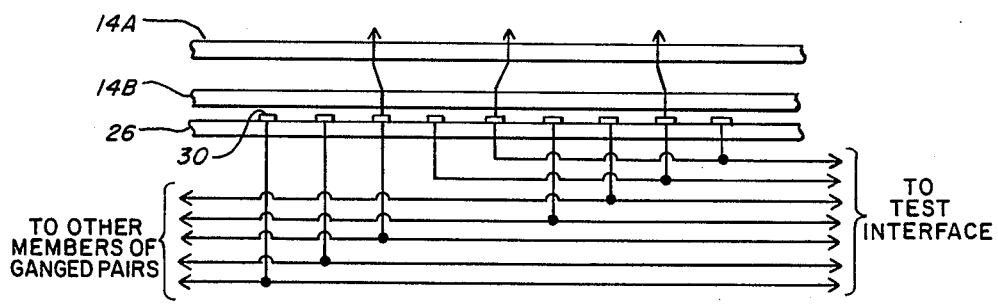
FIG. 14 schematically illustrates the multiple choice of base points available at any given test point.

In the case illustrated in FIG. 13 the test point in question (and, in general, every other test point in the probe plate plane) has a choice of four different base points (holes). This degree of flexibility in the selection of base points permits the application of a unique new base receiver wiring concept and arrangement which is also claimed as a part of the invention. This concept involves the ganging of groups of base points electrically each to a single terminal on the interface to the test system so that the total number of tester terminals required (tester capacity) is reduced by a factor equal to the number of base points in each ganged group. Thus, for example, ganging the base points in pairs would reduce the test system capacity required by one-half. Clearly, in any given test head configuration, only one base point in each ganged group could be utilized; otherwise two or more test points would be shorted electrically thereby invalidating the test results. However, this requirement can generally be realized if the assignment of test points to base points is accomplished by a computer suitably programmed with a knowledge of the precise ganging arrangement used and thus able to avoid assigning more than one member of any ganged group. This process, made possible by the multiple choice of base points available to any given test point, is illustrated in FIG. 14.

Thus the invention permits substantial reduction in fixturing system cost (cost per unit of available test area) in two successive steps:
(1) By permitting a reduction in the number of probes which must be made available (in the magazine) to service the system;
(2) By permitting a further reduction in the number of tester terminals which must be dedicated per unit test area.

Thus, for example, an embodiment with a typical base point density of 50 per square inch (as in FIG. 14) and with the base points wired (ganged) in pairs to the test system terminals, would require only 50 probes per square inch to be available in the magazine (vs 100 probes which must typically be dedicated to each square inch in a conventional universal fixture) and, furthermore, would require a test system capacity of only 25 terminals per square inch of test area (vs 100 per square inch for the conventional universal fixture. Provided that each ganged pair of base points were widely separated in the base matrix, such an arrangement would permit an average test point density of 25 per square inch while allowing the local test point density at one or more locations over the test area to be as high as 50 per square inch. Obviously, a range of different values of average test point density (defined formally as the quotient of the total number of test points on the printed circuit board divided by the active area of the printed circuit board) and of maximum local test point density (defined as the quotient of the number of test points within a given small area of the printed circuit board (say, one sqauare inch) divided by that area can be provided in any given embodiment of the invention by suitable choice of (a) the number of base points, Nb, per square inch and (b) the number of base points Ng, ganged in each group, whereby Average test point density = Nb/Ng and Maximum local test point density = Nb Indeed, it is feature and a claim of the invention that, if so desired, any giveneembodiment can be readily customized to meet a particular user's requirements for bare board testing, depending upon the design and complexity of the printed circuit boards which he customarily handles.

The aforesaid concepts of base point selectivity and base point ganging uniquely permit the application of the invention to loaded board testing including both functional testing (whereby the components and circuitry on the board are tested collectively through the application of external stimuli, and full in-circuit testing, whereby individual components within the circuitry can be separately accessed and tested by appropriately-positioned probes within the fixturing. The application of universal fixturing techniques to loaded board testing in general, and to in-circuit testing in particular has hitherto been prevented by two specific problems peculiar to such test procedures:

(1) Unlike bare board testing, in which electrical continuity is the single element of concern, in-circuit testing involves a variety of different types of applied stimuli and measured response including, for example, digital signals, analog signals, different power supply levels (voltages) ground busses, daisychain common busses, etc. Each and every test point must therefor be interfaced with a specific type of I/O terminal on the test equipment according to its designated stimulus or response type and cannot be arbitrarily assaigned to any interface connection;

(2) In-circuit test systems, because of the aforesaid multiple nature of input/output signals and functions, generally incorporate much fewer test terminals, and certainly could not provide the 100 terminals per square inch typically required by conventional universal test fixtures, even if the first problem, (1) above, were not present.

Figure 15:
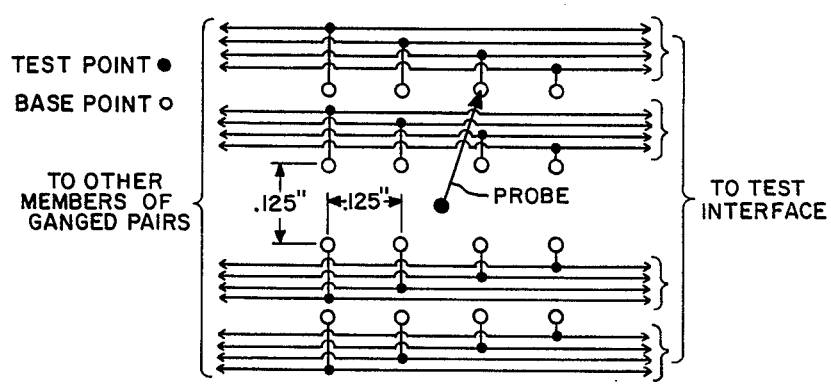
FIG. 15 schematically illustrates the multiple choice of base points.

The present invention eliminates the first problem above by providing each test point with a multiple choice of base points, as illustrated schematically in FIG. 15 herein. In this particular example, the base point density is 64 per square inch while a maximum operational probe offset of 0.3 inches has been chosen. Any particular test point (P) thus has a physical choice of some 16 different base points. If the base receiver is now wired to the interface connector and said connector is connected to an in-circuit test system in such a manner that the individual base points are thereby electrically connected to different types of input/output terminals as defined earlier, in a repeating pattern one-half inch square as illustrated, it is clear that any arbitrarily-positioned test point can, by appropriate selection of base point, access any of a range of different types of input/output terminal, thereby satisfying, in principle, the first requirement for loaded board fixturing as explained above.

The second problem above is eliminated by the application of base point ganging, as defined earlier for the case of bare-board testing. In this case, much higher ganging ratios (Ng) may be used, since the typical test point density is much lower in loaded board testing.

Thus, a combination of base point selectivity and base point ganging made possible by the unique computer program described herein, permits the application of the invention to both bare and loaded board testing. This program takes into account:

(1) The geometry and density of the base points;
(2) The precise ganging formula used;
(3) In the case of loaded board testing, the precise manner in which the base points are patterned and assigned to the various type of input/output terminals on the test system;
(4) The number and precise locations of test points to be addressed by the fixture and, in the case of loaded board testing, of the nature of the signal to be supplied to or received from each individual test point.

Of these factors, the first two are known functions of the fixturing system alone; the third one is a function of the fixturing system and tester interface wiring in combination; and the last is a function of the printed circuit board geometry and also, in the case of loaded board testing, of the actual test specifications involved. The first three factors can thus generally be incorporated within the operational software used to control fixture assembly and disassembly. Information regarding the fourth factor must be supplied individually for each and every different type of printed circuit board tested. This information may be supplied by way of any one or more of a number of well-known communicatin media including paper tape, magnetic tape, floppy disk, etc. or may be entered into the system computer manually via a keyboard, or downloaded directly from an external host computer to provide, in effect, the application software for fixture assembly and disassembly.

Figure 16:
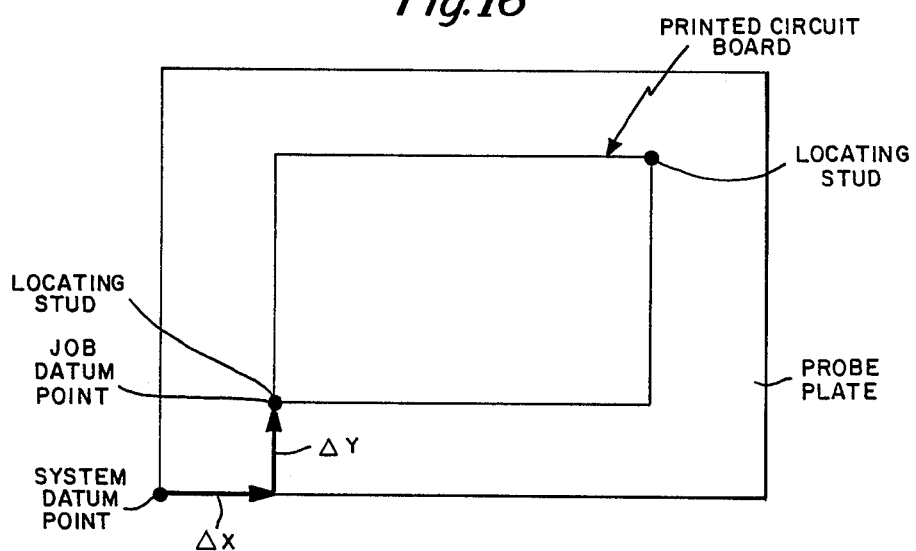
FIG. 16 shows the specific registration between the printed circuit board to be tested and a probe plate within the fixture test head.

The design process whereby the system computer assigns each test point to a specific base point for a given test operation taking into account the aforesaid factors, is summarized schematically in FIG. 15. Test information regarding the distribution of test points and, in each case of loaded board testing, the nature of the signals to or from each point is entered into the system computer using onr or more of the aforesaid communications media. A datum point and orientation within the test area are then chosen to provide a specific registration between the printed circuit boards to be tested and the probe plate within the fixture test head, as shown in FIG. 16. On the basis of the test information supplied, the system computer then proceeds to assign each test point to an appropriate proximate base point, taking into account the aforesaid internal design factors (1), (2), and (3), using an operational software program unique to the invention. Upon completion of this process, the test point assignments, together with their locations within the frame of reference of the fixture, are used to automatically control the fixture assembler so as to configure the test head in the required manner. The list of test point positions and assignments are stored, typically on a floppy disk for use in disassembling the test head upon completion of testing. This floppy disk, which is reserved specifically for a particular printed circuit board, is then stored together with the corresponding probe plate for that printed circuit board for use in subsequent reassembly of the test head for retesting of the board type at any later date.

In regard to the actual base point assignment process, it is possible that a situation may arise wherein valid assignment of all test points cannot be made, even though the distribution of test points falls within the permissible limits of both average test point density and maximum local test point density as defined earlier. In such cases, simple relocation of the regisdtration datum combined, if necessary, with reorientation of the printed circuit board registration will afford a completely new and different set of assignment opportunities to be analyzed. It is obvious that a very large number of such different assignment pattern opportunities are afforded by said datum relocation, and/or reorientation. The operational software is designed to repetitively seek a valid datum location and orientation which will permit completion of the assignment process in the event an invalid solution is encountered.

Finally, the existence of two separate storage media within the system computer, one typically a hard disk, on which the operational software governing the fixture assembly/disassembly process is stored and the other typically a floppy disk, on which the applications software for a specific printed circuit board type is stored, offers unique potential for monitoring:

(1) The electrical performance and mechanical cycling of individual teast probes within the system; and
(2) Test history of individual board types.

Since each probe utilized is inserted into the test head under precise computer control, and subsequently withdrawn and returned to its original receptacle within the magazine, the computer can keep track of probes on an individual basis. If, additionally, the computer can be made aware of the number of test cycles each assembled test head undergoes in a given series of tests, it can maintain a log of the number of cycles undergone by each individual probe. This is latter information is intrinsically available to the computer in cases whre the tester is fully computer integrated with the fixturing system. In cases where assembled fixtures are removed from the assembler and installed in a remote base receiver, the requisite test cycle information can be entered manually into the computer or downloaded from the appropriate test system computer. If means is additionally provided in the embodiment to permit automatic periodic measurement of the electrical resistance of individual probes within the magazine, which means will be readily apparent to those practiced in the art, the computer can be programmed to maintain a log of electrical as well as mechanical performance therby permitting a degree of preventative probe maintenance not hitherto possible in the testing of printed circuit boards.

This concludes a description and discussion of the various concepts and principles underlying the invention. Typical and preferred embodiments of said invention are presented and described hereinafter.

EMBODIMENT OF THE INVENTION

FIG. 17 shows a sectional view of the articulated probe which is the preferred embodiment of the offset probe required of the invention. The probe comprises a barrel 1 within which a center spring retainer 2 is secured by mans of a roll crimp 3. A base terminal 4 incorporates a plunger at one end which is retained within the barrel by a roll crimp 5 being otherwise free to move a short axial distance, stroke, within the barrel. The other, lower, end of the base terminal 6 has a spherical surface for the purpose of making effective electrical contact with the base contact studs, as will be explained further below. A circumferential detent 7 is machined in the plunger a short distance above the base end, which detent provides means for lightly retaining the probe within the magazine or test head as explained further below. A compression spring 8 located within the barrel between the center spring retainer and the upper end of the baSe terminal provides a linearlyincreasing resistance of appropriate magnitude to compression of the probe/terminal combination thereby providing the necessary contact force between probe and contact stud at the lower, base end of the probe and between probe head and printed circuit board at the other end.

An upper spring retainer 9 is located within the upper part of the barrel and loosely retained therein by a roll crimp 10P which permits it to move a very small distance axially within the barrel. A second compression spring 11 of suitable design is located within the barrel between the upper spring retainer and the center spring retainer so that the upper spring retainer is generally forced toward its limit of travel. A probe head 12P is located at the upper end of the probe so that its lower extremity lies within the barrel and is retained therein by a roll crimp 13 acting against a retaining face 14P. A portion of the probe head immediately above the lower end is reduced in diameter 15 so to permit the head to move axially down into the barrel a short distance and also to permit a limited degree of rotation of the probe head about a point located within the lower end of the head. The effect of the connective arrangement is to produce an articulated joint between the probe head and the probe barrel (body) as discussed below. The lower (end) surface of the head 16P is hemispherical in design and sits within a conical depression 16A in the top of the upper spring retainer thereby ensuring circumferential line contact between the two parts. The action of the upper compression spring 11 is to force the probe head toward the upper limit of its travel so that the retaining face is in tight contact with the rolled constriction 13 a the upper end of the barrel. A variety of mechanical interactions between the probe head 16P and the probe barrel 1 can be obtained, depending upon the precise geometries of the retaining face and the roll crimp 13 at the end of the barrel and upon the spring force provided by the spring 11. FIG. 17b illustrates a conical retaining face which interacts with the roll crimp under the action of the spring 11 in such a way as to cause the probe to be self-straightening (i.e. to have a tendency to bring the probe barrel and the probe head into axial alignment in the absence of other external forces. A more extreme version of a self-straightening retaining face geometry is illustrated in FIG. 17c in which the retaining face is flat instead of conical. FIG. 17d shows a spherical retaining face geometry in conjunction with a spherical roll crimp geometry which combination tends to produce a stiff articulated joint wherein, in the absence of external forces, the probe head 16P and probe barrel 1 tend to remain at any given angular displacement. The magnitude of the aforesaid self-straightening or self-maintaining joint mechanisms can be adjusted to a considerable extent by modification of the spring force provided by the upper spring 11. In particular, for example, a spherical retaining face in conjunction with zero spring force (no upper spring present) would produce a freely-connected joint.

Finally, the upper end (tip) of the probe 17 is provided with a suitable geometry of which the conical shape shown is typical, to effect correct mechanical and electrical contact between the tip and test points of various configurations on the printed circuits to be tested.

The location and action of the probe within the test head is illustrated in FIG. 18. When initially inserted into the test head, the probe is positioned with its head running through a test point hole in the probe plate 18P and its base located within a base hole in the base plate 19. In that position, the probe axis is at right angles to the planes of the probe plate and base plate. As illustrated, the base plate comprises a sandwich construction in which a thin layer of elastic or elastomer material 20 (urethane sheet is typical) is bonded between two sheets of rigid, non-conducting material 21, 22 (G-10 glass-impregnated material is typical). The diameter of the base hole drilled through the rigid sheets is substantially greater than that of the probe, so as to permit angular deflection of the probe about its lower, base extremity. The diameter of the base hole through the elastic material is somewhat less than that of the probe so that while the probe can be pushed through the hole with relatively little force, the radial force developed by the expanded material on the probe is sufficient to lightly retain it in the absence of an external axial force. In particular, the probe and test head are designed so that when the probe is fully inserted in the head, the center 24 (position of minimum radius) of the detent near the bottom of the base terminal lies in the plane of the aforesaid elastic or semi-elastic sheet thereby lightly-retaining the probe in a well-defined axial position within the head. When the test head is fully assembled (loaded with probes) and the probe plate is centrally located and locked in the null position ready for testing (as explained in the previous section) the individual probes within it will exhibit a range of offset postions (as measured by the angular deflection between the probe barrel and the normal axis through the probe plate and base plate planes. FIG. 18b for example, shows a probe at the maximum operational angle (typically 10-15 degrees) while FIG. 18c shows a probe (following insertion, but during the assembly process) at the maximum mechanical offset (typically 20-30 degrees).

During the assembly process, those probes which have already been inserted into the test head are subjected to repeat change in offset angle, generally over the entire range of permissible mechanical offset. As the angle of offset of each probe changes during each repositioning motion of the probe plate, the upper spring (retaining) operates like a piston, maintaining a nearly-constant force against the hemispherical bottom face of the probe head so that the "ball-end" of the articulated joint rocks (pivots) at a point defined approximately by the intersection of the probe barrel and the roll crimp at the end fo the barrel. As the angle of deflection increases, the upper spring retainer moves progressively down into the barrel thereby increasing the spring compression and vice-versa as illustrated in FIGS. 18b and 18c.

In the operational (test) mode (as will be explained more fully below) electrical connection between the individual probes within the test head and the test equipment terminals is effected via conducting studs 25 which are brought into position directly beneath the base plate so that they individually protrude into the base holes in the lower rigid sheet 22 of the composite base plate sandwich thereby contacting the lower end of the probes within the head and rigidly restraining the ends from moving axially downwards. Also, in the operational (test) mode the upper ends (heads) of the probes protrude a short distance through the probe plate so that when a printed circuit board is applied against the upper surface of the probe plate (suitably registered so that the test points within it coincide with the probe positions) suitable contact force between the probe tips and the board are developed by reason of the compression of the lower, main probe spring 8. While it is clear that prior to application of the printed circuit board, the tips of the various probes generally protrude above the probe plate by differing amounts, depending upon the angle of offset of each probe, such differences are accomodated during actual board testing by virtue of the considerable amount of compression permitted between the probe barrel and the base terminal plunger. Differences in the individual probe compression forces generated during testing can be reduced to acceptably low levels by provision of pre-compression in the lower, main spring.

The action of the upper spring retainer 9 during the test process requires further discussion, since there are two alternative modes of satisfactory operation. In one case, the force developed by the upper spring 11 is considerably higher than that of the lower (main) spring 8 so that throughout the compression of the probe during testing, the retaining face 14P, of the "ball-joint" at the lower end of the probe head is forced against the end roll crimp 13 to privide sound electrical contact between them and hence between the probe head and the probe body as required for satisfactory electrical performance of the probe. In the other case, the force developed by the upper spring is considerably less than that of the main spring so that whenever a printed circuit board is applied against the probe tips, the lighter, upper spring is compressed first allowing the conical contact face 26 of the upper spring retainer to come firmly in contact with the retaining roll crimp 10P thereby providing a sound electrical path for transmission of signals. These alternative modus operandi are illustrated in FIGS. 18d and 18e.

Figure 19A:
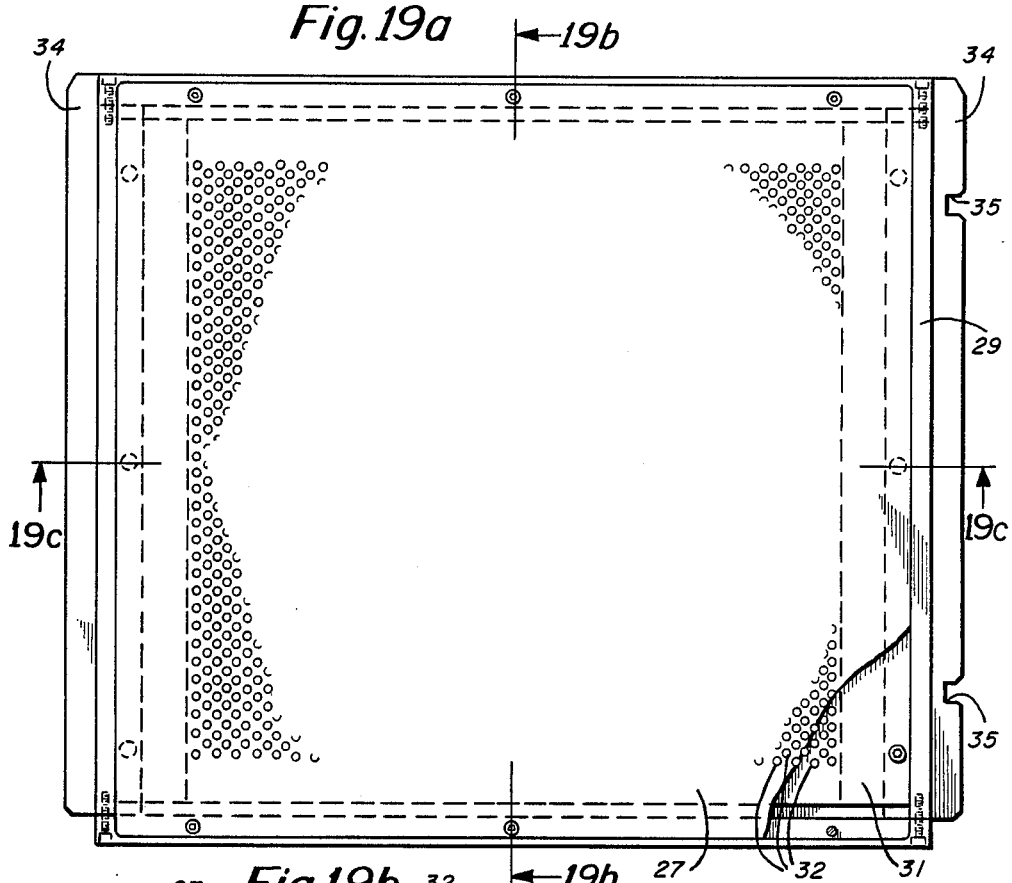
FIG. 19 illustrates details of a preferred embodiment of the magazine of the invention.
Figure 19B:
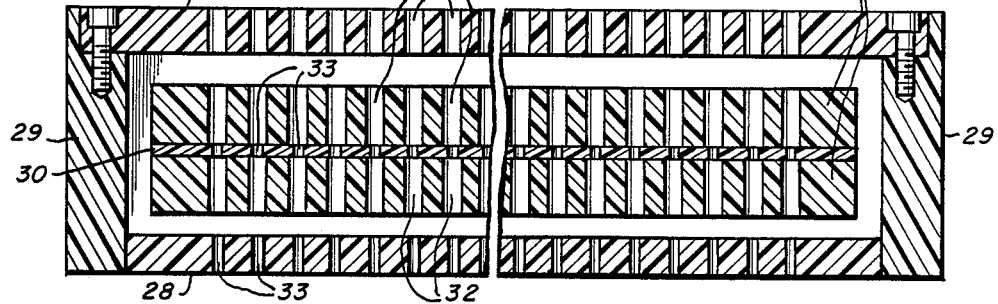
Figure 19C:
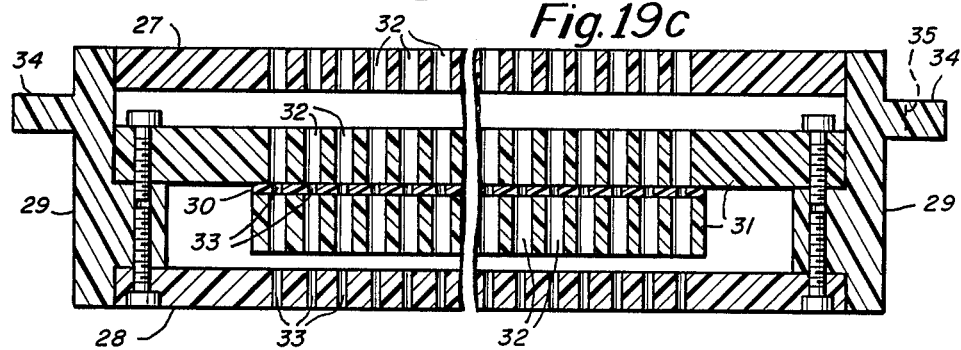
Figure 21B:
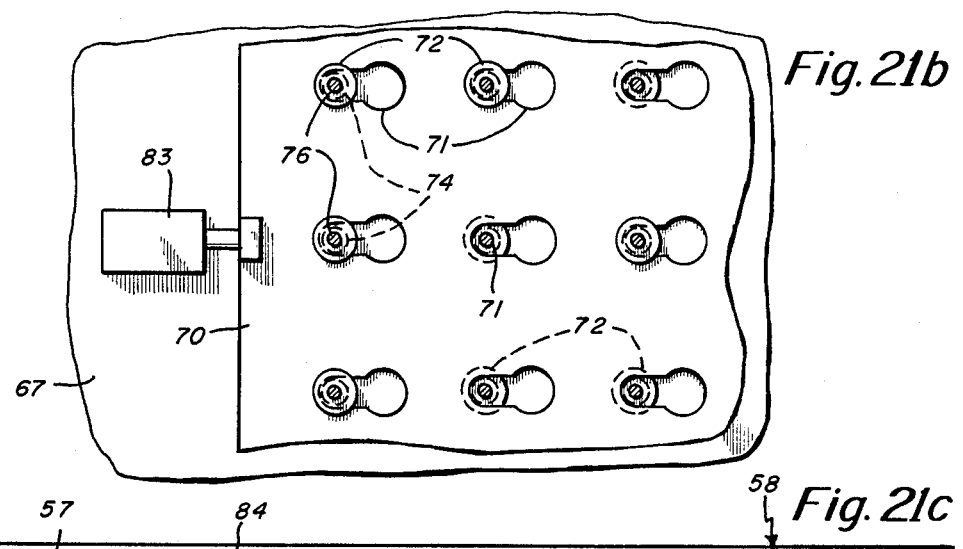
FIG. 21 illustrates a general arrangment of the assembler in accordance with the invention.
Figure 21C:
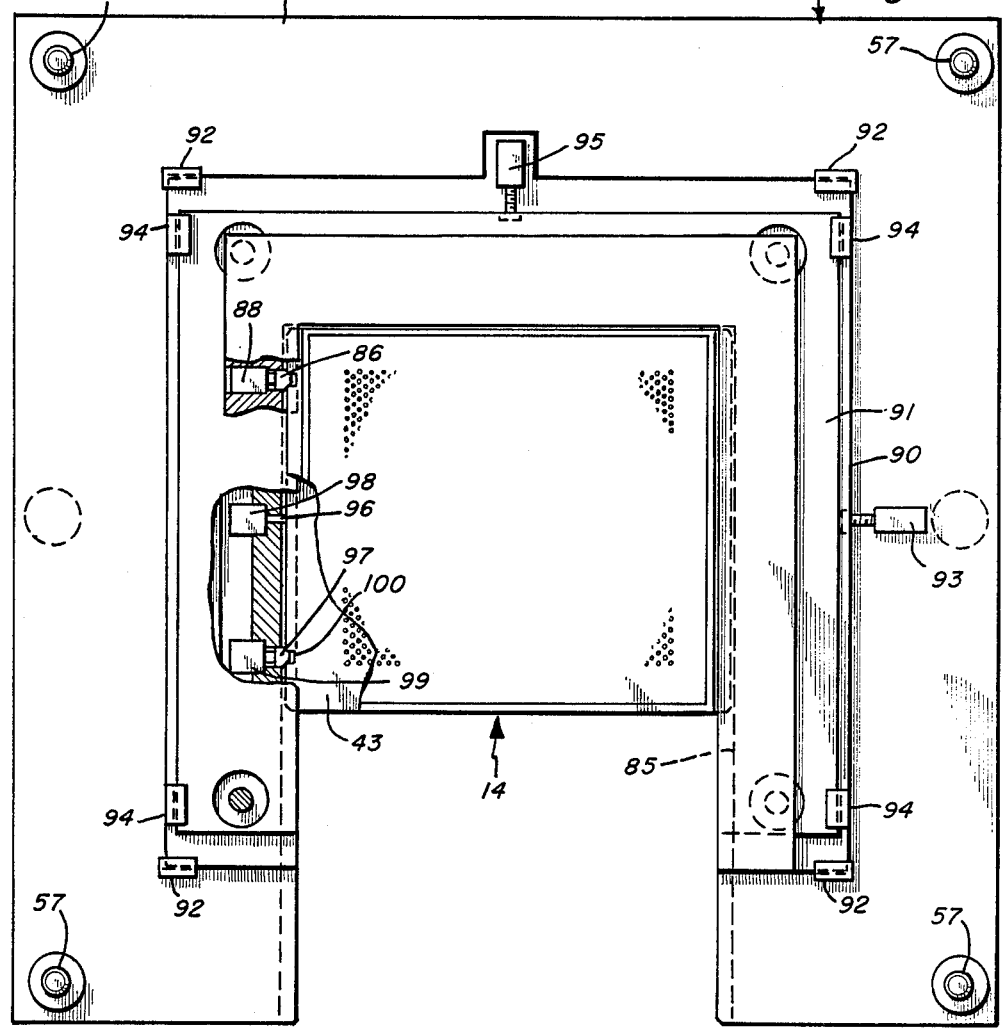

When not inserted within an assembled test head, the probes are retained and stored within a special magazine of unique design. One embodiment of the magazine 10, as illustrated in FIG. 19, comprises upper and lower rigid parallel plates 27 and 28 secured rigidly within a rectangular bounding frame 29. Internally within the magazine is located a composite plate parallel to the upper and lower surface plates which composite plate comprises a thin sheet of elastic or elastomer material 30 bonded between two rigid plates 31. A regular matrix pattern of axially-aligned holes matching the pattern of holes in the test head base plate as described later, is drilled through the upper, lower and inner, composite plates. A typical pattern, incorporating 50 holes per square inch in a staggered pattern is illustrated in FIG. 19. The holes 32 fit for the probes while the holes 33 in the sheet of elastic material within the composite sandwich provide an interference fit with the probe body, thereby lightly retaining any probes inserted into the magazine but permitting smooth insertion and extraction through application of a reasonably small axial force. A rigid lip 34 positioned along each of two opposite sides of the magazine provide means for locating the magazine within the test head assembler mechanism, as explained more fully below. Two rectangular notches 35 on one of these lips provides for accurately locating and locking the magazine within the assembler mechanism, as will also be explained more fully below. The magazine is dimensioned in depth so as retain the probes wholly within the magazine to prevent damage to the probes during handling.

A typical embodiment of the test head 14 is illustrated in FIG. 20. The body of the test head comprises a rigid outer rectangular frame 36 of width and length closely comparable to those of the magazine. The frame incorporates two parallel lips 37 to facilitate location of the test head within the assembler mechanism. One of the lips incorporates two rectangular notches 38 to permit accurate registration and locking of the test head within the assembler. Located within the outer frame is an inner rectangular frame 39 which is free to move a short distance parallel to one pair of sides of the test head within slideways 40. Four guide pins 41 secured within the outer frame locate in clearance holes within the inner, sliding frame to maintain precise alignment of the inner frame as it slides. A probe plate frame 43 comprising a flat rectangular plate somewhat larger than the outside dimensions of the outer frame and having a large rectangular hole cut out of it, is attached to two parallel slide ways 44 positioned close to opposite sides of said probe plate frame. The probe plate frame with the aforesaid parallel slideways attached thereto, is located on top of the inner frame 39 and secured so that it is free to slide a short distance relative to the inner frame in a direction which lies within its own plane and is normal to the direction of permitted motion of the inner frame relative to the outer frame. The probe plate frame is thus contrained by small lips 45 on the slideways 44 which engage as shown with the slideways 40. The probe plate frame is further constrained by four guide pins 46 which are rigidly secured within the inner frame 39 and slide in the clearance holes 47 within the probe plate frame slideways 44. The construction and within the probe plate frame slideways 44. The construction and assembly of the outer and inner frames and probe plate frame is such as to provide, in effect, an X-Y table in which the probe plate frame is free to move a small distance in each direction within its own plane. A removable probe plate 4B comprising a rectangular rigid sheet of material (typically G-10 glass-impregnated material) is dimensioned to fit precisely within the rectangular hole within the probe plate frame wherein it is accurately positioned and secured by means of two datum pins 49 and two screws 50. A composite base plate 51 incorporating means for lightly retaining probes inserted into the test head, as explained earlier in reference to FIG. 18 is securely located within the lower periphery of the outer frame.

Means is provided for locking the movable probe plate frame and the probe plate attached thereto. A knurled knob 52 located in a slot in the front wall of the outer frame rotates on a threaded shaft 53 which is prevented from rotating by means of a pin 54 as shown. Rotation of the knob thus causes the threaded shaft to move up or down, depending upon the direction of rotation of the knob. To lock the probe plate and its frame, the plate/frame combination is moved to its central, null position, and the knurled knob is rotated manually so as to cause the shaft 53 to extend upwards out the outer frame wall and into a hole 55 appropriately located in the probe plate frame.

The test head assembler comprises a mechanism mounted on a heavy base plate 56. Four vertical steel shafts 57 are secured, one at each corner, in the base plate. These shafts carry the superstructure plate 58 of the mechanism, as will be described later. An X-Y table 59 is secured to the base plate among the vertical shafts. A solenoid frame plate 60 secured to the top of the table, carries a matrix of linear solenoids 61 whose plungers 62 protrude vertically upwards through the frame plate. A plunger retainer plate 63 secured parallel to the frame plate and directly below the solenoid matrix, retains the lower ends of the plungers 64 when the solenoids are not activated, thereby permitting them to drop out of the solenoids a short distance. Four vertical steel shafts 65 are secured, one at each corner, in the solenoid frame plate. Two injector rod plates are located directly above the X-Y table on these shafts. The lower plate 66 is secured to the shafts a short distance above the solenoid frame plate. The upper plate 67 is free to move vertically on linear bearings 68. The two plates are drilled with a matrix of holes in axial alignment with the axes of the solenoids in the frame plate.

A lower latching plate 69 is affixed to the lower face of the lower (fixed) injector rod plate 66 in such a manner that it is free to slide, parallel to the injector plate, a short distance parallel to one side of the plate. An upper latching plate 70 of identical design is similarly attached to the upper face of the upper (moving) injector rod plate so that also is free to move a short distance in the same direction. The latching plates incorporate a matrix of keyholes 71 in a pattern precisely matching that of the solenoid matrix. The latching plates are normally positioned so that the circular opening at the larger end of each keyhole is axially-aligned with corresponding holes in the upper and lower injector rod plates and hence with the corresponding solenoid. A matrix of vertical injector rods are located in the holes within the injector rod plates, each rod thus being in axial alignment with a corresponding solenoid. Each identical injector rod incorporates a steel shaft 72 with recesses 73 and 74 machined at the lower and upper ends respectively. A bobbin 75 of substantially larger diameter is located on the shaft at its mid-point. A thin hardened-steel coaxial injector pin 76 extends a considerable distance from the top of the injector rod shaft through a guide plate 77 which is secured to the tops of the vertical shafts 65 carried on the X-Y table. In the typical embodiment of the Invention, solenoids are horizontally-pitched a distance one apart in a square matrix pattern. The X-Y table is designed to permit accurate horizontal motion and positioning of the solenoid array and its associated injector rods over a rectangular area defined by the solenoid pitch, that is to say over a square of side equal to one inch, in the typical case.

The vertical motion of the upper injector rod plate and its attached latching plate is controlled by two sets of pneumatic actuators. Four short-stroke actuators 78 carrying short pistons 79 are located directly below the upper plate, one at each corner thereof. Application of compressed air at a suitable pressure causes these actuators to extend the pistons in unison, thereby raising the plate a short distance. Two long-stroke pneumatic actuators 80 are located directly below the upper plate, one at each side between a pair of the short-stroke actuators. Application of air pressure to these actuators causes the upper plate to be raised a substantial distance.

Motion of the latching plates parallel to the injector rod plates is controlled by four pairs of pneumatic actuators. One pair 81 located on the left-hand-side of the lower injector rod plate, when activated, cause the lower latching plate to slide a short distance to the right, so that the circular opening at the narrow end of each keyhole slot is axially-aligned with its corresponding solenoid and injector rod, thereby closing the latch. A second pair of actuators 82 located at the right-hand-side of the lower plate, when activated, cause the lower latching plate to slide to the left, thereby aligning the large end of each keyhole with its corresponding solenoid/injector rod axis and re-opening the latch. Similarly, a third pair of actuators 83 located at the left-hand side of the upper injector rod plate control the closing (latching) of the upper latching plate while a fourth pair 84 control the opening (unlatching) of the plate.

In a typical operating cycle, a group of injector rods are selected from among the total number thereof and momentarily raised vertically upwards so that their injector pins extend up through and above the guide plate, as described below. At the beginning of the cycle, the upper injector rod plate is in its lowest position wherein it lower face is held a short distance above the upper face of the lower injector rod plate by virtue of the injector rod bobbins. Both latching plates are unlatched. The following sequential operations are then performed to complete the injector rod cycle.

(1) the lower latching plate is closed (latched so that the narrow portion of each keyhole engages the recess at the lower end of the corresponding injector rod shaft, thereby locking and securing all injector rods to the lower, fixed injector rod plate;
(2) the short-stroke actuators are activated, thereby raising the upper injector rod plate a short distance;
(3) the lowe latching plate is unlatched;
(4) those solenoids which correspond to the particular injector rods selected for raising are activated by application of suitable electrical current so that their plungers rise and come into contact with the lower ends of the selected rods, thereby raising them until the upper faces of their bobbins are in contact with the lower surface of the upper injector rod plate;
(5) the upper latching plate is latched so that the keyholes engage the recesses in the upper ends of the raised injector rods therby locking them to the upper injector rod plate;
(6) the lower latching plate is latched thereby locking the remaining (unselected) injector rods to the lower injector rod plate;
(7) the long-stroke actuators are activated thereby raising the upper injector rod plate to its upper limit position and causing the selected injector rods locked to it to extend upwards through and above the guide plate as required;

The selected injector rods are returned to their places in the matrix in the following sequential steps:
(1) the long-stroke actuator is retracted until the upper injector rod plate comes into contact with the extended piston of the short-stroke actuator;
(2) the lower latching plate is unlatched;
(3) the upper latching plate is unlatched to allow the selected injector rod bobbins to drop down into the lower, fixed injector plate and thus rejoin the injector ro matrix;
(4) the short-stroke actuators are released, thereby allowing the upper injector rod plate to drop down on top of the bobbins and into its original position.

The purpose of the selectable injector rod activation system described above will become clear in the course of the following discussion.

The remainder of the assembly mechanism is carried on a fixed horizontal support plate 84 which supported by and secured to the vertical support shafts affixed to the corners of the base plate. The support plate has a cut-out in the front equal approximately in size to and located directly above the matrix of injector rods carried on the X-Y table below. Two horizontal support slots 85 are located one above the other on each side of the cut-out permit the test head and the magazine to be inserted one above the other into the cut-out directly above the injector rod matrix as indicated. In the assembly mode, the magazine is inserted in the inverted position (probes pointing down) in the lower slot, while the test head is inserted, also in the inverted position, in the upper slot. In the disassembly mode, the positions are reversed with the magazine inserted in the upper slot in the upright position and the test head below, also in the upright position. This arrangement, in the prefered embodiment, results in inverted assembly and reverse out disassembly, as defined earlier. In both the assembly and disassembly modes, the juxtaposition of the test head and magazine is such as to place the test head probe plate centrally between the magazine and the body of the test head. Following insertion into the supports slots, the magazine and test head are individually accurately positioned and locked in each set of slots by means of a positioning wedge 86 and a pressure pad 87 respectively which are extended laterally through the slots on one side of the cut-out by small pneumatic actuators S8 and 89. The wedges, when activated, are forced into the corresponding location notches in the lips of the test head and magazine on that side. The action of the wedges is primarily to locate and precisely position the test head and magazine in the y-wise (front to back) direction. The action of the pressure pads is to force the test head and magazine laterally against the support slots on the opposite side of the cut-out, thereby positioning the accurately in the x-wise (side-to-side) direction. When the magazine and test head are inserted in combination and locked into the cut-out as described above, the lower surface of the lower element (top plate of the inverted magazine in tne assembly mode; base plate of the test head in the disassembly mode) is positioned directly above and very close to the top of the injector rod guide plate.

Two think plates, an X-plate 90 and a Y-plate 91 are positioned one above the other on top of the support plate, each plate having a cut-out to accomodate the test head/magazine combination. The X-plate can move a small distance in the X-wise direction within slideways 92 affixed to the support plate. A linear actuator 93 secured to the support plate drives the X-plate so that it can be accurately positioned at any point within its small range of travel. The Y-plate is mounted on slideways 94 affixed to the X-plate so that it can move over a small distance in the Y-wise direction relative to the X-plate. A second linear actuator 95 secured to the X-plate drives the Y-plate so that it can be accurately positioned relative to the X-plate at any point within its small range of the travel. The combination of the X-plate and Y-plate and their respective linear drivers thus forms a differential X-Y table. A pressure pad 96 and a wedge 97 are attached respectively to pneumatic actuators 98 and 99 secured at one side of the cut-out in the Y-plate. When the test head is inserted and locked in the assembly mechanism as described above, in either the inverted assembly position or the upright disassembly poition activation of the actuators 98 and 99 causes the wedge to locate within a notch 100 in the edge of the probe plate, thereby accurately locating it in the Y-wise direction, and causes the pressure pad to force the probe plate in the X-wise direction against the opposite side of the Y-plate thereby accurately positioning it in the X-wise direction. Thus locked, the probe plate can be driven an positioned relative to the fixed frame of the test head by appropriate energization of the linear actuators 3 and 95.

I claim:

1. An automatic fixturing system for printed circuit board testing comprising;
    a magazine for temporarily storing a plurality of probes therein,
    each said probe having a probe head at one end thereof and a probe base at the other end thereof,
    a test head adapted to receive selected ones of the probes and position the probes in a pattern matching test points on the printed circuit board,
    means supporting the test head adjacent to the magazine and in a position to receive probes from the magazine,
    means for transferring selected ones of the probes from the magazine to the test head,
    a base member positioned adjacent the test head on one side thereof in a position to contact the base of each probe,
    means for supporting the printed circuit board adjacent the test head on an opposite side thereof to the base member with the head of each probe adapted to be in intimate contact with a test point on the printed circuit board,
    said test head comprising a probe plate and a base plate, said probe and base plates being positioned substantially in parallel and separated by a spacing therebetween substantially the same as the probe length,
    said probe plate being disposed adjacent said printed circuit board and said base plate being disposed adjacent said base member during testing,
    said means for transferring including separate injector rod means for contacting each probe for transferring to the test head with the head of each probe protruding through a probe plate aperture while the base of the probe is disposed in a base plate aperture which has been specifically assigned to said probe plate aperture,
    and means for moving the probe plate in its own plane relative to the base plate during said transfer so that one or more probe plate apertures may at any given time be momentarily aligned with their corresponding pre-assigned base plate apertures and with the corresponding probe locations in the adjacent magazine, along axes perpendicular to the probe and base plates, so as to permit transfer of the corresponding probes in a straight line between the magazine and test head and always in a direction at a right angle to both probe and base plates.

2. An automatic fixturing system as set forth in claim 1 wherein said probes are transferred in multiple groups.

3. An automatic fixturing system as set forth in claim 2 wherein the holes in the base plate are disposed in a repeatable matrix pattern while the holes in the probe plate are disposed in a test pattern arrangement.

4. An automatic fixturing system as set forth in claim 1 wherein the head of each probe is supported at the probe plate aperture and the means for supporting the printed circuit board is for support thereof in a position closely proximate to said probe plate whereby the probe leads extend only slightly from the probe plate for direct contact thereof with circuit points on the printed circuit board.

5. An automatic fixturing system as set forth in claim 1 wherein said base member comprises a base receiver including a housing having a base piece supporting a plurality of electrical contact elements.

6. An automatic fixturing system as set forth in claim 5 wherein the electrical contact elements are disposed in an array corresponding positionally to the probe bases.

7. An automatic fixturing system as set forth in claim 3 wherein said base member carries electrical contact elements disposed in an array corresponding positionally to the holes in the test head base plate and hence to the bases of any probes occupying said holes.

8. An automatic fixturing system as set forth in claim 1 wherein said magazine comprises upper and lower plates and a circumferential frame supporting said upper and lower plates in spaced relation.

9. An automatic fixturing system as set forth in claim 1 wherein said test head comprises a rigid rectangular frame of width and length comparable to that of the magazine.

10. An automatic fixturing system as set forth in claim 9 wherein said test head comprises an outer frame and an inner frame disposed within the outer frame and free to move a short distance parallel to at least one pair of sides of the test head outer frame.

11. An automatic fixturing system as set forth in claim 1 in combination with a test head assembler which comprises a mechanism mounted on a heavy base plate.

12. An automatic fixturing system as set forth in claim 1 in combination with a fixture assember mechanism which, under computer control, is capable of automatically loading probes from the magazine into the fixture into a configuration suitable for testing a specified printer circuit board; and subsequently unloading the probes from the fixture back into the magazine on completion of testing.

13. An automatic fixturing system as set forth in claim 12 wherein the loading and unloading are carried out in a relatively short period of time.

14. An autoamtic fixturing system as set forth in claim 1 wherein the base member is adapted to accept and accomodate configured fixtures mechanically and electrically thereby providing a direct electrical connection between each probe and a suitable input/output terminal on an external PCB test system via an interface connector located in the receiver.

15. An automatic fixturing system as set forth in claim 14 wherein, in the case of bare board testing, the base member is wired so as to significantly reduce the total number of input/output terminals dedicated to the fixturing system wherein said reduction is achieved by electrically ganging contacts in the base in combinations of at least pairs.

16. An automatic fixturing system for printed circuit board testing comprising;
a magazine for temporarily storing a plurality of probes therein,
a test head adapted to receive selected ones of the probes and position the probes in a pattern matching test points on the printed circuit board,
means supporting the test head adjacent to the magazine and in a postion to receive probes from the magazine,
means for transferring selected ones of the probes from the mgazine to the test head,
a base member positioned adjacent the test head on one side thereof in a position to contact the base of each probe,
and means for supporting the printed circuit board closely adjacent the test head on an opposite side thereof to the base member with the head of each probe adapted to be in intimate contact with a test point on the printed circuit board
each probe comprising an articulated probe which permits offset thereof when disposed in said test head,
said probe including two substantially linear and rigid probe sections including one section carrying a probe head and another section having a probe base, and an articulated joint having a defined pivotal hinge point intercoupling the sections to permit the one section to pivot relative to the other section within a prsecribed range of angular deflection measured between the respective center lines of the sections.

17. An automatic fixturing system as set forth in claim 16 wherein said articulated probe comprises a barrel supporting at one end a base terminal for providing electrical contact and at the other end supporting a probe head.

18. An automatic fixturing system as set forth in claim 17 wherein said base terminal includes a plunger retained within the barrel but capable of short axial movement within the barrel.

19. An automatic fixturing system as set forth in claim 18 including an intermediate disposed spring retainer disposed in the barrel between ends thereof.

20. An automatic fixturing system as set forth in claim 19 including one compression spring located within the barrel between the intermediate disposed spring retainer and the upper end of the base terminal, and a second compression spring located within the barrel between an upper spring retainer and the intermediately disposed spring retainer.

21. An automatic fixturing system as set forth in claim 20 wherein a portion of the probe head immediately above the lower end is reduced in diameter so as to permit the head to move axailly down into the barrel and also to permit a limited degree of rotation of the probe head about a point located within the lower end of the head.

22. An automatic fixturing system as set forth in claim 21 wherein the lower surface of the probe head is hemispherical in design and sits within a conical depresssion in the top of the plunger thereby insuring circumferential line contact 23. An automatic fixturing system for printed circuit board testing comprising;
a magazine for temporarily storing a plurality of probes therein,
a test head adapted to receive selected ones of the probes and position the probes in a pattern matching test points on the printed circuit board,
means supporting the test head adjacent to the magazine and in a position to receive probes from the magazine,
means for transferring selected ones of the probes from the magazine to the test head,
a base member positioned adjacent the test head on one side thereof in a position to contact the base of each probe,
and means for supporting the printed circuit board adjacent the test head on an opposite side thereof to the base member with the head of each probe adapted to be in intimate contact with a test point on the printed circuit board,
said magazine comprising upper and lower plates in a circumferential frame supporting said upper and lower plates in spaced relation, and a composite plate parallel to the upper and lower plates, said composite plate comprising a thin sheet of elastomer material bonded between two rigid plates.

24. An automatic fixturing system as set forth in claim 23 wherein a matrix pattern of axially aligned holes matching the pattern of holes in the test head lower plate is drilled through the composite plate structure.

25. An automatic fixturing system as set forth in claim 24 including means associated with said magazine for locating the magazine relative to the test head.

26. An automatic fixturing system for printed circuit board testing comprising a test head containing a plurality of probes disposed therein with the base end of all probes being in a predetermined matrix pattern and the head end of the probes being in a test point pattern, a base member positioned adjacent the test head on one side thereof in a position to contact the base of each probe, and means for supporting the printed ciruit board closely adjacent its test head on an opposite side thereof to the base member with the head of each probe adapted to be intimate contact with a test point on the printed circuit board, said test head comprising a probe plate for receiving the head end of the probes and a base plate for receving the base end of the probes, said probe and base plates being positioned substantially in parallel and separated by a spacing therebetween substantially equal to the probe length, said probe including two substantially linear and rigid probe sections including one section carrying a probe head and another section having a probe base, and an articulated joint having a defined pivotal hinge point intercoupling the sections to permit the one section to pivot relative to the other section within a prescribed range of angular deflection measured between the respective center lines of the sections, and means for providing relative movement between the probe and base plates so as to align the probes with apertures in the plates.

27. An automatic fixturing system as set forth in claim 26 further including a magazine for temporarily storing the plurality of probes, means for supporting the test head adjacent the magazine and in a position to receive probes from the magazine and, means for transferring selected ones of the probe from the magazine to the test head.

28. An automatic fixturing system as set forth in claim 27 wherein said means for transferring includes ejector rod means said means for supporting the printed circuit board including a pressure plate being urged against the printed circuit board by means of said ejector rods.

29. An automatic fixturing system as set forth in claim 28 wherein one of said probe plate and base plate are movable slightly relative to the other so as to align the probes for the purpose of probe transfer between the magazine and test head.

30. An automatic fixturing system as set forth in claim 26 wherein the number of holes comprising the matrix pattern is greater than the number of probes and wherein the probes have the capability of covering all holes.

31. An automatic fixturing system as set forth in claim 27 wherein the probes are held with small retaining pressure in the magazine so as to permit easy withdrawal therefrom.

32. An automatic fixturing system as set forth in claim 26 wherein the means for providing relative movement first provides relative movement to align probes of a first group followed by subsequent alignment of probes of a second group, whereby probes of the first group are offset when the probes of the second group are aligned.

33. An automatic testing system for the testing of printed circuit boards comprising a test head containing a plurality of probes disposed therein and comprising a probe plate and a base plate, said probe and base plates being positioned in spaced relationship therebetween with the spacing therebetween substantially the same as the probe length, the base end of all probes being retained by the base plate and being in a predetermined matrix pattern, and the head end of the probes being retained in the probe plate and in a test point pattern, means for moving the probe plate small distances in its own plane relative to the base plate during probe porpulation of the test head so that at least one probe plate aperture may at a given time be momentarily aligned with a corresponding pressigned base plate aperture along an axis perpendicular to the probe and base plates, so as to permit transfer of the corresponding probes in a straight line between the probe and base plate apertures and always in a direction at a right angle to both probe and base plates, and injector rod means for contacting each probe for transfer to the test head.

34. An automatic testing system as set forth in claim 33 wherein said means for moving the probe plate first provides movement to align probes of a first group followed by subsequent alignment of probes of a second group, whereby probes of the first group are offset when the probes of the second group are aligned.

35. An automatic testing sstem as set forth in claim 34 further including a magazine for temporarily storing the plurality of probes, means for supporting the test head adjacent the magazine and in a position to receive probes from the magazine, and means for transferring selecting ones of the probes from the magazine to the test head.

36. An electrically-conducting test fixture for use in fixturing of printed circuit boards and other circuit devices during automatic testing of the electrical and electronic viability and reliability of such boards and devices, said fixture comprising;

a base member, a base plate, a probe plate a plurality of probes, each comprising
two rigid sections including a base section and a probe section connected by an articulated joint having a defined pivotal hinge point so designed as to permit one such section to rotate about the center of the joint relative to the other seciton within a prescribed range of angular deflection measured between the respective center lines of the sections, a tip at the end of the probe section remote from said joint so designed as to provide suitable electrical probing contact with a designated test point on a printed circuit board or other circuit device, a termination at the end of the base section remote from the joint and so designed as to provide suitable electrical contact with the base member positioned adjacent to and in contact with said termination, both said sections being of elongated probe-like configuration with the probe section supported with the tip thereof extending through said probe plate, and the termination supported in the base plate means associated with each probe for maintaining the base section and the probe section connected prior to supporting the probe section with the tip thereof extending through said probe plate 37. A test probe as set forth in claim 36 wherein each of said sections includes a straight part.

38. A test probe as set forth in claim 37 which incorporates a compression spring in one of said sections so as to permit, under an axial load of suitable magnitude, compression of said setion along its centerline.

39. A test probe as set forth in claim 38 in which the compression section of the probe is the base section thereof and the termination of the base section is essentially spherical.

40. A test probe as set forth in claim 39 in which the articulated joint comprises a spherical ball-shaped termination at the joint end of one section of the probe working within a cup-shaped socket termination at the joint end of the other section, means being provided for maintaining said ball-end within said socket.

41. A test probe as set forth in claim 40 in which a secondary spring is located in one section of the probe adjacent to the joint socket so that it exerts pressure on the ball-end of the joint, to provide friction between the ball-end and the socket during rotation thereof, thereby resulting in a suitable degree of stiffness of the joint.

42. A test probe as set forth in claim 41 in which the maximum probe offset, defined as the normal distance between the end of the base section remote from the joint and the extended axis of the probe section, afforded by rotation of the joint, is substantially greater than the maximum diameter of the probe.

43. A fixturing system for application in testing printed circuit boards and other similar circuit devices, said system comprising;
  a magazine for storing a plurality of electrically-conducting probes, each probe having a head at one end suitable for contacting said printed circuit board or circuit device and a base,
  a test head comprising a probe plate with apertures in a pattern matching that of the test points on the circuit device and a base plate, located proximate and parallel to said probe plate, and having a regular repeatable pattern of apertures,
  means for populating the test head with selected probes from the magazine including separate mechanical injector means contacting each of the probes with the head of each probe protruding through a probe plate aperture while the base of the probe is located in the base plate aperture which has been specifically assigned to said probe plate aperture; wherein the lateral offset of any probe, defined as the normal distance between the axis of the probe plate aperture and the axis of the corresponding assigned base plate aperture, is substantially greater than the diameter of the larger of said probe and base plate apertures,
  a base receiver positionable adjacent the test head on one side thereof, incorporating a matrix of electrical contact studs arranged in a pattern which matches the pattern of base plate apertures,
  and means for supporting the printed cirucit board or circuit device on the opposite side of the test head so that the head of each probe in the test head is in appropriate intimate contact with said circuit board or device.

44. A fixturing system as set forth in claim 43 wherein the scale of the base aperture pattern is such that each and every probe plate aperture can be preassigned to any one of a multiplicity of base plate apertures within the maximum offset capability of the probe.

45. A fixturing system as set forth in claim 43 in which the probes are retained in the magazine in a regular parallel array which matches the pattern of apertures in the test head so that when the magazine is correctly positioned adjacent the test head, each probe in the magazine is axially aligned with a corresponding base plate aperture.

46. A fixturing system as set forth in claim 45 wherein means are provided for automatically transferring selected probes from said magazine into said test head so that each probe is correctly positioned in the test head and for subsquently transferring said probes from the test head back into the magazine.

47. A fixturing system as set forth in claim 43 wherein means are provided for moving the probe plate small distances in its own plane relative to the base plate during said transfer process so that one or more probe plate apertures may at a given time be momentarily aligned with their corresponding preassigned base plate apertures and with the corresponding probe locations in the adjacent magazine along axes perpendicular to the probe and base plates, so as to permit transfer of the corresponding probes in a straight line between the magazine and test head.

48. A fixturing system as set forth in claim 47 in which the means for transferring probes between the magazine and the test head comprises a parallel array of selectable injector rods, disposed in a pattern which matches the pattern of apertures in the base plate and the pattern of probe locations in the magazines.

49. A fixturing system as set forth in claim 48 which includes means for locating and securing the test head and magazine in close proximity adjacent to said injector array during said transfer process, so that the injector rods are axially aligned with the corresponding set of base plate apertures and with the pattern of probe locations in the magazine.

50. A fixturing system as set forth in claim 49 in which the magazine is interposed between the injector array and the test head for the purpose of transferring probes from magazine to test head, and in which the test head is interposed between the injector array and the magazine for the purppose of transferring probes back into the magazine.

51. A fixturing system as set forth in claim 50 in which means is provided for activating any arbitrary group of injector rods at a given time.

52. A fixturing system as set forth in claim 51 in which each injector rod comprises a long thin rod of sufficiently small diameter to permit it to pass easily through the apertures in both the probe and base plates, and through the apertures in the magazine in which the probes are normally retained, and a short bobbin of somewhat larger diameter secured axially to the rod at the end remote from the magazine and test head, said bobbin comprising a relatively narrow circular center section enclosed between two thin circular end plates of somewhat larger diameter.

53. A fixturing system as set forth in claim 52 which includes:
  two indential thin locking plates, each plate incorporating a regular pattern of keyhole-shaped apertures matching precisely the pattern of injector rods, each keyhole aperture comprising a circular hole, sufficiently large to permit passage of the injector rod and bobbin through the plate, and a narrower slot sufficiently wide to accommodate only the reduced center portion of the bobbin, said plates being positioned in close parallel proximity within the injector array so that the rods are perpendicular to the plates and the bobbin end of each passes through the larger ciruclar part of the corresponding keyhole aperture in each plate, means for moving each plate a short distance in its own plane so that any bobbin positioned midway through the plate is whereby locked to the plate and prevented from moving axially relative to the plate, an array of electrical solenoids disposed directly adjacent to the bobbin end of the array of injector rods so that each solenoid when activated moves a corresponding injector rod a short distance axially through the pair of locking plates, the precise positioning of the plates and the stroke of the solenoids being such that the bobbins of all rods so ativated lie part way through the first locking plate, while the bobbins of the remaining unactivated rods lie part way through the second locking plate, means for moving the first locking plate with activated rods locked to it in a direction normal to the plate so that the activated rods move axially through the corresponding apertures in the magazine and test head, thereby transferring probes between the two units, means for securing the second plate so that all remaining unactivated rods are thereby retained and prevented from moving inadvertently during the probe transfer process.

54. A fixturing system as set forth in claim 53 in which the number of injector rods is reduced to a small fraction of the total number of base plate apertures/magazine probe locations, so that each injector rod is required to service a multiplicity of base plate apertures/probe magazine locations.

55. A fixturing system as set forth in claim 54 in which the reduced number of injector rods are arrayed in a regular matrix pattern such that each injector rod services an identical pattern and number of base plate apertures/probe magazine locations.

56. A fixturing system as set forth in claim 56 in which the means is included for successively moving the entire injector array relative to the test head and magazine parallel to them in such a manner that each injector rod is aligned in turn with each base plate aperture/probe location serviced by it, such movement being controlled and coordinated so as to effect the total transfer of probes between the magazine and test head in an efficient manner.

57. A fixturing ssytem as set forth in claim 43 in which the probe is articulated, incorporating two straight rigid sections connected by an electrically-conducting mechanical joint.

58. A fixturing system as set forth in claim 43 in which the choice of base plate aperture preassigned to each probe plate aperture from said multiplicity of available base plate apertures, is made according to a special strategy designed to enhance the overall efficiency and effectiveness of the fixturing system as defined by system cost, operating time and range of application of the system.

59. A fixturing system as set forth in claim 58 in which the particular strategy employed in the assignment of base plate apertures to probe plate apertures is such as to permit the system to be fully-serviced by a test system in which the total number of tester I/O terminals is substantially smaller than the total number of base plate apertures in the base receiver.

60. A fixturing system as set forth in claim 58 in which the assignment strategy employed is such as to permit the application of the fixture system to in-circuit functional testing of circuit devices, wherein it is required to effect the interconnection of the various test points on the circuit device under test with a variety of different types of tester I/O terminal.

61. A fixturing system as set forth in claim 60 in which the base studs in the base receiver are interconnected with the in-circuit test equipment in a repeating pattern of closely-knit groups, the members of each group being interconnected with different types of teseter I/O terminals in specified proportions, and each group being of a size generally defined by a circle of radius equal to the maximum operational offset of the system probes so that any test point on a circuit device under test can be interconnected with any specified type of tester I/O terminal by assigning the corresponding probe plate aperture to a base plate aperture which will engage a base receiver stud interconnected with the tester I/O type specified.

62. A fixturing system as set forth in claim 61 in which ganging (multiple wiring) of the base receiver studs is employed to permit the system to be fully-serviced by the relatively small number of I/O terminals available on the typical in-circuit tester.

63. A method of fixturing a test head to be used in the testing of printed circuit boards, comprising the steps of; providing a plurality of test probes each of which is capable of at least some side-to-side displacement between head and base ends thereof, providing a probe plate an a base plate, positioning the probe and base plates in spaced parallel relationship therebetween, said probe plate having probe plate apertures for receiving probe heads and said base plate having base plate apertures for receiving probe bases, initially positioning the probes in a parallel array outside of the base and probe plates, displacing the probe plate by a small amount in the direction of the plane of the probe plate so as to align a predetermined set of base plate apertures with corresponding probe plate apertures and transferring a corresponding set of probes along axes perpendicular to the probe and base plates so as to transfer the set of probes in a straght line to the probe and base plate apertures and in a direction at a right angle to both probe and base plates.

64. A method as set forth in claim 63 further including displacing the probe plate again in a direction in the plane thereof so as to align a second set of base plate apertures with corresponding probe plate apertures and transferring a corresponding second set of probes along axis perpendicular to the probe and base plates so as to transfer the second set of probes in a straight line to the probe and base plate apertures, said first set of probes experiencing some side-to-side displacement upon subsequent displacement of said probe plate.

65. A method as set forth in claim 64 wherein the step of providing probes includes providing articulated probes having rigid end sections interconnected by an articulating joint to permit relative pivoting between end sections.

66. A method as set forth in claim 65 wherein the articulated probes may be angularly offset and wherein when the second set of probes are transferred the first set is laterally offset.

* * * * *